(12) United States Patent
Dames et al.

(10) Patent No.: US 12,089,333 B2
(45) Date of Patent: Sep. 10, 2024

(54) ELECTRICITY METER

(71) Applicant: SENTEC LTD, Cambridge (GB)

(72) Inventors: Andrew Nicholas Dames, Cambridge (GB); Dawei Zhi, Cambridge (GB); Joseph Adam, Impington (GB)

(73) Assignee: SENTEC LTD, Cambridge (GB)

( * ) Notice: Subject to any disclaimer, the term of this patent is extended or adjusted under 35 U.S.C. 154(b) by 608 days.

(21) Appl. No.: 17/295,582

(22) PCT Filed: Nov. 20, 2019

(86) PCT No.: PCT/GB2019/053285
§ 371 (c)(1),
(2) Date: May 20, 2021

(87) PCT Pub. No.: WO2020/104797
PCT Pub. Date: May 28, 2020

(65) Prior Publication Data
US 2022/0022322 A1   Jan. 20, 2022

(30) Foreign Application Priority Data

Nov. 20, 2018 (GB) ...................................... 1818876
Apr. 4, 2019 (GB) ...................................... 1904763

(51) Int. Cl.
*H05K 1/11* (2006.01)
*G01R 15/18* (2006.01)
(Continued)

(52) U.S. Cl.
CPC ........... *H05K 1/165* (2013.01); *G01R 15/185* (2013.01); *G01R 21/06* (2013.01); *H05K 1/0259* (2013.01); *H05K 1/115* (2013.01)

(58) Field of Classification Search
CPC ...... H05K 1/165; H05K 1/0259; H05K 1/115; G01R 15/185; G01R 15/18; G01R 21/06
See application file for complete search history.

(56) References Cited

U.S. PATENT DOCUMENTS

| 6,414,475 B1 | 7/2002 | Dames et al. |
| 2008/0180206 A1* | 7/2008 | Fouquet .............. H01F 27/2804 336/200 |

(Continued)

FOREIGN PATENT DOCUMENTS

| EP | 2712082 A1 | 3/2014 |
| EP | 2846163 A1 | 3/2015 |

OTHER PUBLICATIONS

International Search Report and Written Opinion from related international application PCT/GB2019/053285, mailed on Apr. 2, 2020, all pages cited in its entirety.

(Continued)

*Primary Examiner* — Roshn K Varghese
(74) *Attorney, Agent, or Firm* — Burr & Forman LLP

(57) ABSTRACT

An electricity meter (17) is described which includes a conductor (19) for transferring energy from a supply (20) to a load (21). The electricity meter (17) also includes a multi-layer printed circuit board (18) mechanically attached to the conductor (19). The multi-layer printed circuit board (18) includes two or more insulating layers (26, 27, 33, 34). The two or more insulating layers (26, 27, 33, 34) include a first insulating layer (26, 27) having an attachment surface (28) facing the conductor (19). The multi-layer printed circuit board (18) also includes a first conductive layer (29) including a first planar sensor coil (30). The first insulating layer (26, 27) is between the first conductive layer (29) and the conductor (19). The multi-layer printed circuit board (18) also includes a second conductive layer (31) including a second planar sensor coil (32). The multi-layer printed circuit board (18) also includes a second insulating layer (26, 33) between the first (29) and second (31) conductive layers. The first planar sensor coil (30) and the second planar sensor coil (32) are electrically connected to one another by a buried via (40), or the first planar sensor coil (30) and the (Continued)

second planar sensor coil (32) are electrically connected to one another by a blind via (38) extending inwards from a back surface (35) of the multi-layer printed circuit board (18), the back surface (35) being opposed to the attachment surface (28).

20 Claims, 15 Drawing Sheets

(51) Int. Cl.
   *G01R 21/06*    (2006.01)
   *H05K 1/02*    (2006.01)
   *H05K 1/16*    (2006.01)

(56)     References Cited

U.S. PATENT DOCUMENTS

2016/0131682 A1  5/2016 Scholz et al.
 2017/0178786 A1* 6/2017 Lambert ............. H01F 41/0206

OTHER PUBLICATIONS

Office Action from Canadian Application No. 3118576 dated Jun. 10, 2022, all pages cited in its entirety.
Images of icon 2s meter depicting product on sale prior to 2010.

* cited by examiner 36, 77

55, 79

ELECTRICITY METER

TECHNICAL FIELD

The present invention relates to an electricity meter, in particular an electricity meter which operates based on inductive sensing of the current delivered to a load. The present invention also relates to multi-layer printed circuit boards for use in an electricity meter and/or for use with a mutual inductance current sensor.

BACKGROUND

Products for electric power measurement typically use voltage dividers and current sensors to feed low voltage signals into analogue to digital converters (ADC's), and form a measure of the instantaneous power by multiplying these current and voltage signals together. In electricity metering applications, this power signal is integrated over time into energy, which is typically used as the basis for billing. The performance requirements for such systems may be defined by standards applicable to particular jurisdictions, such as American National Standards Institute (ANSI) ANSI C12, Under writers Laboratories (UL) UL 2735, International Electrotechnical Commission (IEC) IEC62053 or European standard/European Norm (EN) EN50470, and typically include power accuracy over a wide dynamic range of currents (for example 0.2% of power over a ~1000:1 range) and power accuracy when the phases of the fundamental current and voltage waveforms do not match (for example 0.3% of power over a range of ±60°). This leads to corresponding demanding requirements on the performance of the current measurement system, requiring high accuracy of magnitude and phase performance over a very wide dynamic range.

In many applications (for example ANSI form 2 or form 12 meters, or 2-wire IEC meters which measure both conductors to detect tampering), several currents at different potentials have to be measured, and hence electrical isolation between the current sensors (and to the ADC's) is required, normally where currents at different potentials need to be measured. Mutual inductance sensors, for example Rogowski coil sensors, have become increasingly popular because they provide electrical isolation, and also because of their inherent linearity over a wide dynamic range of currents. There are many types and styles of inductive current sensors, typically comprising one or more air-cored coils with a mutual inductance to a primary current carrying inductor. These can be fixed coil sensors such as the PA3202NL from Pulse Electronics, flexible Rogowski coils such as the MFC150 from Algodue or U.S. Pat. No. 9,494,620 described by Dames et al., or planar coils such as described by Dames et al. in U.S. Pat. No. 6,414,475, Colby et al. in U.S. Pat. No. 6,734,661 or Storkey in U.S. Pat. No. 8,378,662, or any other type or geometry of mutual inductance sensor which has a response which is broadly proportional to the rate of change of current.

U.S. Pat. No. 10,132,839 (Dames et al) describes a means to mount a sensor PCB to a busbar using an insulating carrier. For sinusoidal A.C. currents, such as might be ideally found in A.C. power systems, the mutual inductance coil sensor output is also a sinusoid, phase shifted by 90 degrees relative to the current. Utility electric meters are often specified to class 0.2, which demands a high level of current sensor gain stability over temperature and time, ideally better than 0.1% over twenty years. The electricity meters are often mounted externally to buildings, so can undergo significant temperature cycling over this time. Mutual inductance sensors have advantages in this application, particularly versions without magnetic material, as they can easily be approximately linear and also provide the desired isolation, sometimes up to 4 kV, 6 kV or 10 kV even for low voltage metering applications.

SUMMARY

According to a first aspect of the present invention there is provided an electricity meter including a conductor for transferring energy from a supply to a load. The electricity meter also includes a multi-layer printed circuit board mechanically attached to the conductor. The multi-layer printed circuit board includes two or more insulating layers. The two or more insulating layers include a first insulating layer having an attachment surface facing the conductor. The multi-layer printed circuit board also includes a first conductive layer including a first planar sensor coil. The first insulating layer is between the first conductive layer and the conductor. The multi-layer printed circuit board also includes a second conductive layer including a second planar sensor coil. The multi-layer printed circuit board also includes a second insulating layer between the first and second conductive layers. The first planar sensor coil and the second planar sensor coil are electrically connected to one another by a buried via, or the first planar sensor coil and the second planar sensor coil are electrically connected to one another by a blind via extending inwards from a back surface of the multi-layer printed circuit board, the back surface being opposed to the attachment surface.

The electricity meter may be for fiscal or non-fiscal purposes. The conductor may be a bus-bar. The buried via or blind via connecting the first and second planar sensor coils may be encircled by each of the first and second planar sensor coils. Each of the first and second planar sensor coils may be formed as a spiral track.

An effective magnetic centre of the first planar sensor coil may be substantially co-axial with an effective magnetic centre of the second planar sensor coil. The first planar sensor coil may include one or more turns having a first sense of rotation about the common effective magnetic centre of the sensor coils, and the second planar sensor coil may include one or more turns having a second sense of rotation about the common effective magnetic centre, the first and second senses of rotation being opposite. The first planar sensor coil may include one or more turns wound clockwise about a common effective magnetic centre, and the second planar sensor coil may include one or more turns wound anti-clockwise (counter-clockwise) about the common effective magnetic centre. The first planar sensor coil may be connected by a second blind via to a conductive track or conductive pad disposed on the back surface of the multi-layer printed circuit board. The second planar sensor coil may be connected by a third blind via to a conductive track or conductive pad disposed on the back surface of the multi-layer printed circuit board.

The blind via or buried via may be arranged within an area defined by (or equivalently may be encircled by) the turns of the first planar sensor coil and/or the second planar sensor coil.

The attachment surface may be mechanically attached to the conductor directly or indirectly.

The attachment surface may be bonded to the conductor, for example using adhesive.

The multi-layer circuit board of the electricity meter may also include a third conductive layer which includes a conductor track disposed on the attachment surface of the first insulating layer. The conductor track may be mechanically attached to the conductor.

The conductor track and conductor may be mechanically attached and electrically connected. The conductor track may be formed of copper with a coating of immersion silver (IS). The conductor track may be formed of silver. The conductor track may not be formed of copper.

One or more conductive layers of the multi-layer printed circuit board may include non-magnetic plating. The non-magnetic plating may be disposed in a region corresponding to the conductor. Outside a region corresponding to the conductor, magnetic plating may be useable. External conductive layers may be plated. Internal conductive layers, i.e. between the first insulating layer and the back surface, may not be plated. Internal conductive layers may include or be formed from copper.

The conductor may be soldered to the conductor track of the multi-layer printed circuit board.

A thickness of solder between the conductor and the conductor track may be less than or equal to 0.3 mm (0.012 inches).

The conductor may be attached to the conductor track of the multi-layer printed circuit board using conductive adhesive. The conductor may be brazed to the conductor track of the multi-layer printed circuit board. The conductor may be sintered to the conductor track of the multi-layer printed circuit board. The conductor may be welded to the conductor track of the multi-layer printed circuit board.

The multi-layer printed circuit board may also include a fourth conductive layer disposed between the first insulating layer and the first planar sensor coil. The fourth conductive layer may define a first electrostatic shield. The multi-layer printed circuit board may also include a third insulating layer disposed between the first electrostatic shield and the first planar sensor coil.

The multi-layer printed circuit board may also include a fifth conductive layer disposed between the back surface and the second planar sensor coil. The fifth conductive layer may define a second electrostatic shield. The multi-layer printed circuit board may also include a fourth insulating layer disposed between the second electrostatic shield and the second planar sensor coil.

The first planar sensor coil, the second planar sensor coil and the electrostatic shield layer(s) may be electrically connected to one another and to ground by the blind via extending inwards from the back surface.

The first planar sensor coil, the second planar sensor coil and the electrostatic shield layer(s) are electrically connected to one another by the buried via.

The multi-layer printed circuit board may also include one or more additional conductive layers. Each conductive layer may include an additional planar sensor coil.

The multi-layer printed circuit board may also include one or more additional insulating layers. Each additional planar sensor coil may be separated from the first planar sensor coil, the second planar sensor coil and each other additional planar sensor coil by at least one insulating layer. Each of the additional planar sensor coils may be electrically connected to at least one other planar sensor coil by a buried via, or by a blind via extending inwards from the back surface.

An effective magnetic centre of each of the first, second and additional planar sensor coils may be co-axial with an effective magnetic centre of each other of the first, second and additional planar sensor coils.

The first, second and any additional planar sensor coils may be connected together in series. The rotational directions of planar sensor coils connected in series may alternate.

The multi-layer printed circuit board may also include one or more components mounted directly or indirectly on the back surface. The multi-layer printed circuit board may also include one or more components mounted directly on the back surface. The multi-layer printed circuit board may also include one or more components mounted on a conductive layer disposed over the back surface. The planar sensor coils may be connected to at least one of the components through one or more blind vias.

The one or more components may be positioned so as not to overlap the conductor track. The one or more components may include one or more connectors. The connectors may be configured to receive one or more wires, a coaxial cable, a flexible flat cable (FFC), or any other suitable type of cable for electrical connection.

In dependence upon the components and/or connectors include magnetically active materials, such components and/or connectors may be directly or indirectly supported on the back surface so as to not overlap within 3 mm (0.118 inches) of a projected outer periphery of the conductor mechanically attached to the attachment surface. Components and/or connectors including magnetically active materials may be directly supported on the back surface. Components and/or connectors including magnetically active materials may be supported on a conductive layer disposed over the back surface.

If any of the components and/or connectors include magnetically active materials, then such components and/or connectors may be supported on the back surface so as to be within 1 mm (0.039 inches), within 2 mm (0.079 inches) or within 3 mm (0.012 inches) from a projected outer periphery of the conductor mechanically attached to the attachment surface.

The conductor may define a loop, or a portion of a loop, having first and second loop ends separated by a gap.

The loop may include an annular portion between the first and second loop ends. The annular portion may be substantially circular. The loop may be omega-shaped.

Conductive layers of the multi-layer printed circuit board may be plated with silver, tin or other non-magnetic materials. Conductive layers of the multi-layer printed circuit board may include no (or only impurities of) magnetic materials such as iron, nickel, cobalt and so forth. External conductive layers of the multi-layer printed circuit board may be coated using immersion silver (IS). External conductive layers of the multi-layer printed circuit board are preferably not treated using hot air solder levelling (HASL) or electroless nickel immersion gold (ENIG) processes.>

An effective magnetic centre of the first planar sensor coil may be substantially co-axial with an effective magnetic centre of the second planar sensor coil, and the common effective magnetic centre of first and second planar sensor coils may be offset from a centre of the loop in a direction towards the gap.

The common effective magnetic centre of first and second planar sensor coils may be offset from the centre of the omega-shaped conductor track along an axis parallel to a line passing through the centre of the gap and the centre of the omega-shaped conductor track.

The common effective magnetic centre of first and second planar sensor coils may be arranged to substantially correspond with a stationary point of a sensitivity in µV/A as a function of the position of the common effective magnetic centre in a plane perpendicular to a thickness of the multi-layer printed circuit board. The common effective magnetic centre of first and second planar sensor coils may be arranged to substantially correspond with a stationary point of an amplitude of the component of a magnetic flux perpendicular to the multi-layer printed circuit board, the magnetic flux corresponding to that which would be generated by a current flowing through the conductor.

The first planar sensor coil may include a first number of turns having a first sense of rotation, and a second number of turns connected in series with the first number of turns, the second number of turns having a second, opposite sense of rotation. The second planar sensor coil may include a third number of turns having the second sense of rotation, and a fourth number of turns connected in series with the third number of turns, the second number of turns having the first sense of rotation.

The first and second planar sensor coils may be configured such that a first voltage signal induced in the first number of turns in response to a magnetic other than from the conductor will be substantially equal and opposite to a second voltage signal induced in the second number of turns by the magnetic flux, and a third voltage signal induced in the third number of turns in response to the magnetic other than from the conductor will be substantially equal and opposite to a fourth voltage signal induced in the fourth number of turns by the magnetic flux.

Cancellation of the first and second voltage signals and/or the third and fourth voltage signals may be realised for a uniform magnetic field or a magnetic field having a linear or substantially linear gradient. The turn-area products of the first and second numbers of turns may be of equal and opposite magnitudes. The turn-area products of the third and fourth numbers of turns may be of equal and opposite magnitudes.

A creepage distance across the surface of the multi-layer printed circuit board between the conductor and an exposed electrical connection of the multi-layer printed circuit board may be greater than or equal to 7 mm.

A creepage distance between the conductor track and an exposed electrical connection of sensor printed circuit board may be greater than or equal to 0.276 inches. A creepage distance between the conductor track and an exposed electrical connection of sensor printed circuit board may be greater than or equal to 9.535 mm. A creepage distance between the conductor track and an exposed electrical connection of sensor printed circuit board may be greater than or equal to 3/8 inches.

A maximum length of any side of the printed circuit board may be 32.5±5 mm. A maximum length of any side of the printed circuit board may be 1.280±0.197 inches. A maximum length of any side of the printed circuit board may be 34.5±5 mm. A maximum length of any side of the printed circuit board may be 1.358±0.197 inches.

The first planar sensor coil, the second planar sensor coil and/or any additional sensor coils may be formed using a PCB track having a width of less than 0.15 mm (0.006 inches). The first planar sensor coil, the second planar sensor coil and/or any additional sensor coils may be formed using a PCB track having a gap of less than 0.15 mm (0.006 inches) between adjacent turns.

The thickness of the first insulating layer may be greater than 0.29 mm (0.011 inches).

The electricity meter may also include a second conductor for transferring energy from a supply to a load. The electricity meter may also include a second multi-layer printed circuit board mechanically attached to the second conductor. The second multi-layer printed circuit board may be identical to the multi-layer printed circuit board.

The electricity meter may include one or more further conductors for transferring energy from a supply to a load. Each further conductor may be mechanically attached to a corresponding further multi-layer printed circuit board. Each further multi-layer printed circuit board may be identical to the multi-layer printed circuit.

The sensitivity of an inductive current sensor formed by the conductor and the multi-layer printed circuit board may be at least 60 µV/A.

The electricity meter may meet American National Standards Institute, ANSI, requirements.

The electricity meter may meet International Electrotechnical Commission, IEC, requirements.

The electricity meter may meet American National Standards Institute, ANSI, requirements which are effective on the priority date of this specification, in particular UL-2735. The electricity meter may meet European standards EN62053-31:2015 or EN50470-1:2006 as effective on the priority date of this specification. The electricity meter may meet International Electrotechnical Commission, IEC, requirements which are effective on the priority date of this specification.

According to a second aspect of the invention, there is provided a multi-layer printed circuit board for mechanical attachment to a conductor. The multi-layer printed circuit board including two or more insulating layers. The two or more insulating layers including a first insulating layer having an attachment surface for mechanical attachment to the conductor. The multi-layer printed circuit board also including a first conductive layer including a first planar sensor coil. The first insulating layer is between the first conductive layer and the conductor. The multi-layer printed circuit board also including a second conductive layer comprising a second planar sensor coil.

The multi-layer printed circuit board also including a second insulating layer between the first and second conductive layers. The first planar sensor coil and the second planar sensor coil are electrically connected to one another by a buried via, or the first planar sensor coil and the second planar sensor coil are electrically connected to one another by a blind via extending inwards from a back surface of the multi-layer printed circuit board which is opposed to the attachment surface.

The conductor may be a part of an electricity meter.

According to a third aspect of the invention, there is provided a current sensor comprising a PCB with layers providing at least first and second sensor coils, each sensor coil comprising an axis about which one or more turns of conductive track are formed and an effective magnetic centre which lies on a common axis with the other sensor coil, wherein the turns are connected directly or indirectly at least in part to an electrical connection on the pcb, a conductor or busbar, wherein the conductor is rigidly attached to one side of the pcb with an electrical connection on the opposite side of the pcb to the busbar.

The PCB may have at least one buried via encircled by a sensor coil.

The PCB may be soldered to the conductor with at least one buried via encircled by a sensor coil.

The PCB may have at least one blind via encircled by a sensor coil

The PCB may be soldered to the conductor with a blind via encircled by a sensor coil.

The PCB may have two electrostatic screens which sandwich the sensor coils.

The PCB may have two electrostatic screens and two sensor coils wherein the centre of the coils and the shields are connected together.

The PCB may have two electrostatic screens and two sensor coils wherein the centre of the coils and the shields are connect together and to ground.

The PCB may have non-magnetic plating at least in the region of an Omega form in the busbar.

The common axis of the sensor coils may be offset from the centre of the Omega form in the conductor.

The sensitivity of the sensor may be at least 60 microvolts/Amp Magnetic components and magnetic connectors may be attached on the opposite side of the PCB to the busbar and may be placed at less than 3 mm within the projected outer periphery of the Omega.

The creepage distance between the busbar and an exposed electrical connection on the sensor PCB may be greater than 7 mm.

The length of one side of the sensor PCB may be 34.5 mm+/−5 mm.

The sensor coil may be formed using a PCB track and gap of less than 0.15 mm.

The solder thickness between the busbar and the Omega shaped pad on the PCB may be less than 0.3 mm.

The PCB insulation thickness between the busbar surface closest to the PCB and the nearest conducting layer connected to the electrical connection on the PCB may be greater than 0.29 mm.

The current sensor(s) may be part of a utility meter.

The sensor(s) may be part of a utility meter which meets ANSI requirements.

The sensor(s) may be part of a utility meter which meets IEC requirements

According to a fourth aspect of the invention, there is provided an electricity meter including a conductor for transferring energy from a supply to a load. The electricity meter also includes a multi-layer printed circuit board mechanically attached to the conductor. The multi-layer printed circuit board includes two or more insulating layers, the two or more insulating layers including a first insulating layer having an attachment surface facing the conductor and a second insulating layer having a back surface opposed to the attachment surface across the multi-layer printed circuit board. The multi-layer printed circuit board also includes a first conductive layer comprising a first planar sensor coil. The first insulating layer is between the first conductive layer and the conductor. The first conductive layer is between the first and second insulating layers. The first planar sensor coil is electrically connected to the back surface by a blind via extending inwards from the back surface.

This invention relates to the field of A.C. current sensing using mutual inductance sensors, which have outputs proportional to the rate of change of current, particularly but not exclusively when used in electrical power measurement applications. The invention related to a compact, highly sensitivity, highly linear current sensor, with excellent creepage and voltage standoffs capabilities, which can be manufactured at low cost.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

This invention relates to the field of alternating current (AC) current sensing using mutual inductance sensors, which have outputs proportional to the rate of change of current being measured, particularly but not exclusively, when used in electrical power measurement applications. The current sensor is a single sided mutual inductance current sensor built into a product and attached to the current carrying busbars/conductors before calibration. The current sensor may be used in, but is not limited to, utility electric meters.

Figure 1:
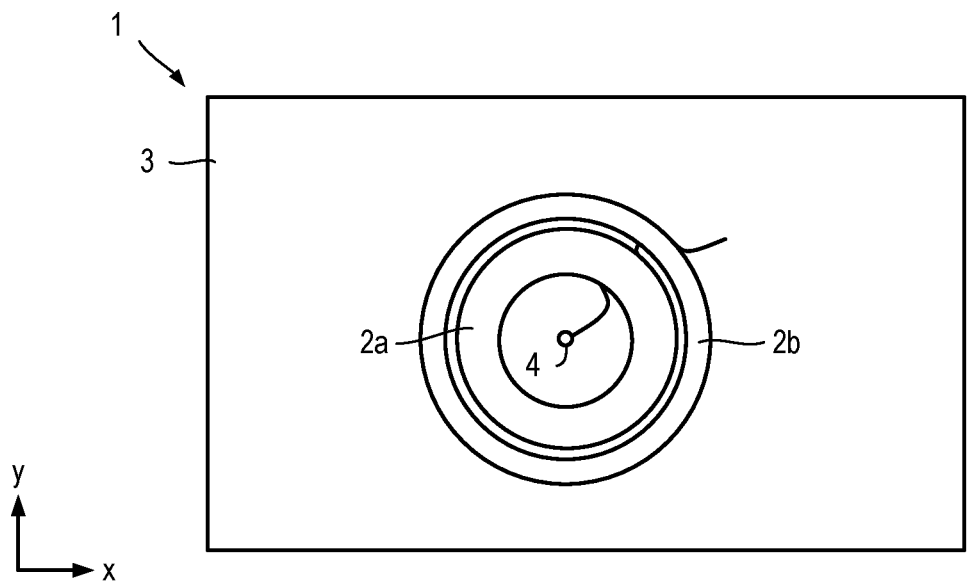
FIG. 1 is a plan view of a prior art current sensor.
Figure 2:
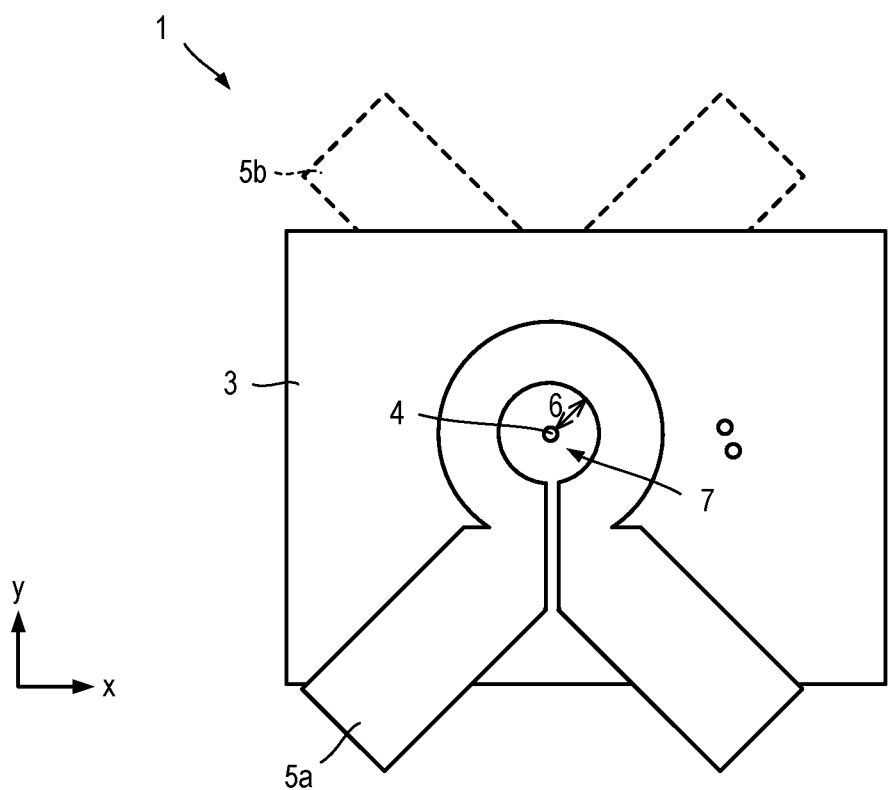
FIG. 2 is a plan view of the current sensor shown in FIG. 1, overlaid by a conductor.

Referring to FIGS. 1 and 2 a prior art current sensor 1 is shown.

The current sensor 1 uses sensor coils 2a, 2b disposed within inner layers of a single printed circuit board 3. A pair of sensor coils 2a, 2b are arranged one on top of the other within the inner layers of the printed circuit board 3. Each sensor coil 2a, 2b includes a first number of turns 2a in a first rotational direction, and a second number of turns 2b in a second, opposite rotational direction. This provides excellent sensor coil matching and stability between the at least two sense (sensor) coils 2a, 2b which are connected together in the centre using a through via 4 (for example a plated through-hole); the current(s) to be sensed flows through busbar(s) or conductor(s) 5a, 5b. The sensor PCB 3 is designed to ensure a fast fall off of its sensitivity to extraneous currents away from the sensor 1. Within the constraints of the planar geometry (x, y) in the major plane) of the PCB 3 the sensors 2a, 2b typically have a sensitivity to currents that drops with distance in a z axis (the axis orthogonal the major plane of the sensor PCB 3). The drop off is often several tens of percent of sensitivity per mm, which is unlike traditional Rogowski arrangements. To engineer an accurate electricity meter using these devices 1 thus requires a highly stable attachment between the sensor PCB 3 and conductor (busbar) 5a, 5b that keeps the sensor PCB 3 in a fixed alignment in close proximity to the conductor (busbar) 5a 5b.

A minimum creepage distance 6 is indicated in FIG. 2. The minimum creepage distance 6 is controlled by the diameter of the through via 4 and the diameter of a loop section 7 formed by the conductor 5a (busbar). This has a disadvantage as it requires a diameter of the loop section 7 to be increased in line with the voltage requirements, thus making the conductor (busbar) 5a and the PCB 3 larger, more expensive and less able to fit any space constraints of an intended application.

Also the high level of voltage standoff required between conductors (busbars) 5a, 5b in an electricity meter typically requires high levels of isolation between electronics and the conductors (busbars) 5a, 5b. Isolation is most commonly obtained in electrical products by use of a dielectric spacer, often plastic, between the parts requiring isolation. This can be problematic in this application (electricity meters) due to the very high mechanical stability required, and the desire to avoid loss in sensitivity from unduly increased separation between sensor coils 2a, 2b and the conductor(s) (busbar(s)) 5a, 5b. The issue of mechanical stability of position is compounded in many meter products, as the metal conductors (busbars) 5a, 5b are often also the interconnect parts to the outside world, and may get distorted by external forces from sockets or cage clamps (not shown).

The invention described by the present specification may realise a more compact, low cost current sensor which may have improved current sensitivity and/or mechanical stability, whilst achieving increased levels of creepage distance and standoff voltage. In addition, in some examples the ability to assemble the sensor within a larger assembly by using a connector may be incorporated.

The use of low cost connectors with some ferromagnetic properties (for example Iron, Nickel components and so forth), and the choice of the plating applied to the sensor PCB 3 may cause problems with the sensor's 1 linearity especially at higher currents. These problems have also been addressed by examples of the invention described herein.

The relative position of the loop section of a conductor, for example an Omega-shaped loop, and the sensor coils has been found to provide maximum sensitivity when a mechanical offset is applied in the assembly process. The mechanical offset may also reduce the variation in sensitivity of a production population of sensors, which may improve the control of the process and reduce production calibration time.

Figure 3:
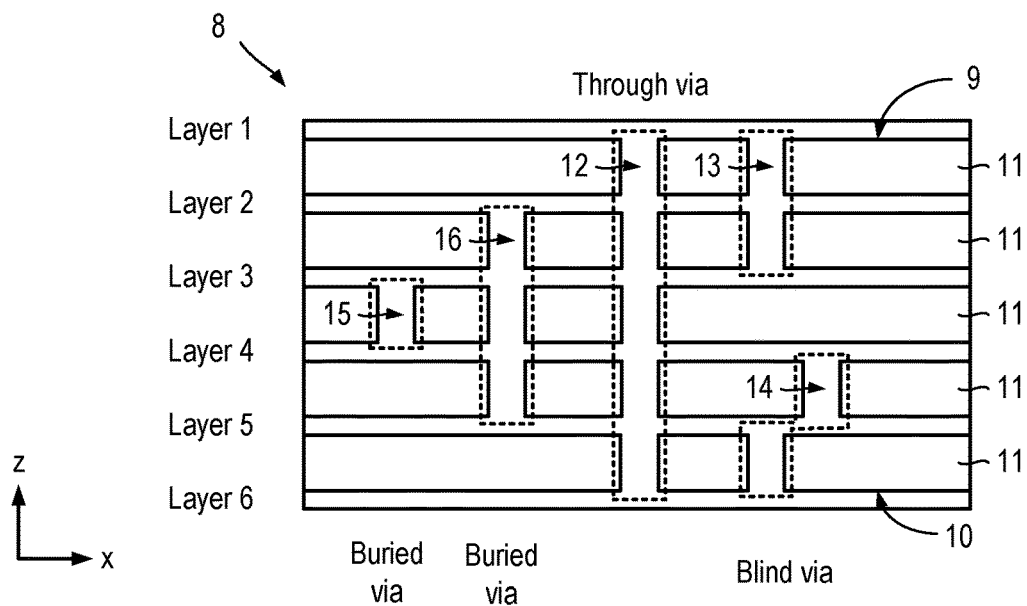
FIG. 3 illustrates the meaning herein of the terms "blind via", "buried via" and "through via"

Referring also to FIG. 3, definitions of terminology used to describe different types of via are illustrated.

A multi-layer printed circuit board 8 has a top surface 9 and a bottom surface 10. A conductive "layer 1" is disposed on the top surface 9 and a conductive "layer 6" is disposed on the bottom surface 10. These, and further conductive "layer 2" through "layer 5" are separated and electrically isolated from one another by insulating layers 11.

The term "through via" refers to a via 12 which connects between the top and bottom surfaces 9, 10. The term "blind via" refers to a via 13, 14 which connects to one of the top or bottom surfaces 9, 10, but not to both. It may be noted that in practice, unless drilled or otherwise formed in-situ, a via may comprise holes through the insulating layers 11 which are not precisely aligned, for example as illustrated by blind via 14. The term "buried via" refers to a via 15, 16 which spans through one of more insulating layers 11 without connecting to either the top surface 9 or the bottom surface 10.

Figure 4:
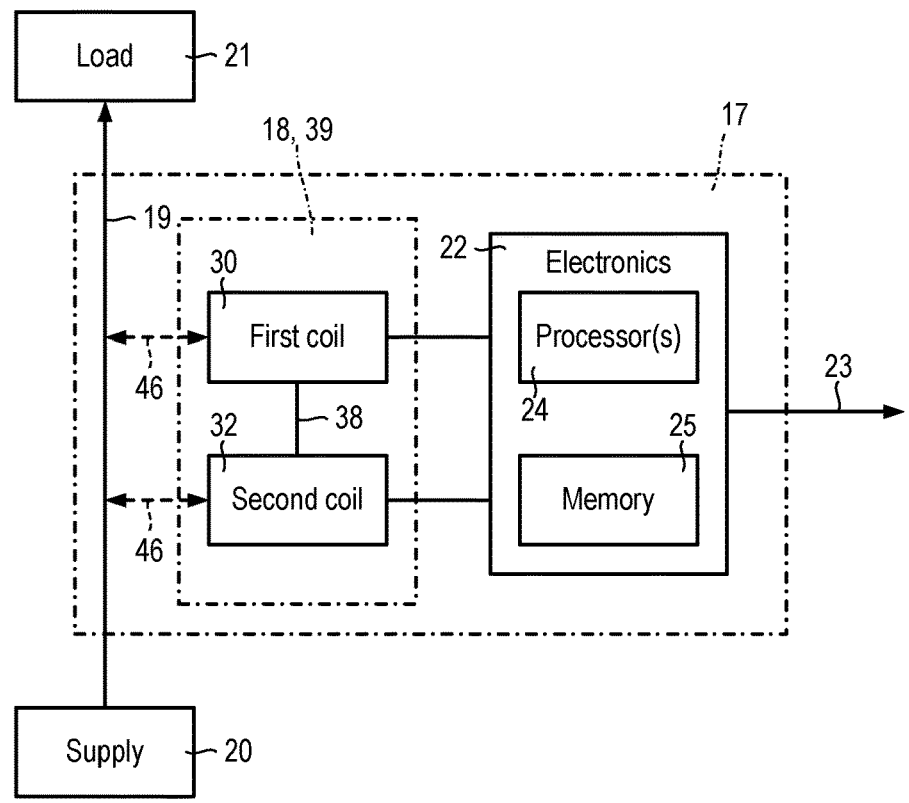
FIG. 4 is a block diagram of an electricity meter.

Referring to FIG. 4 a block diagram of an electricity meter 17 is shown.

Figure 5:
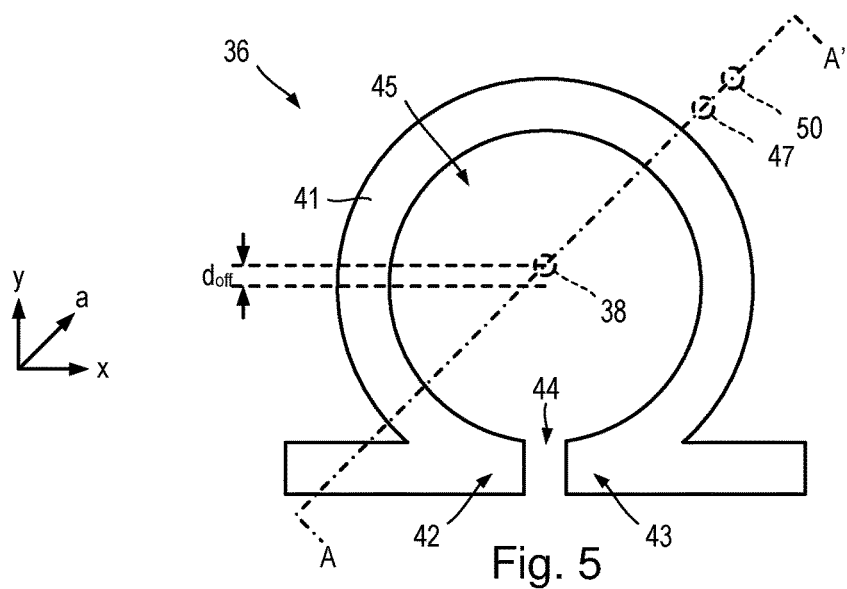
FIG. 5 is a plan view of a third conductive layer of a first multi-layer printed circuit board.
Figure 6:
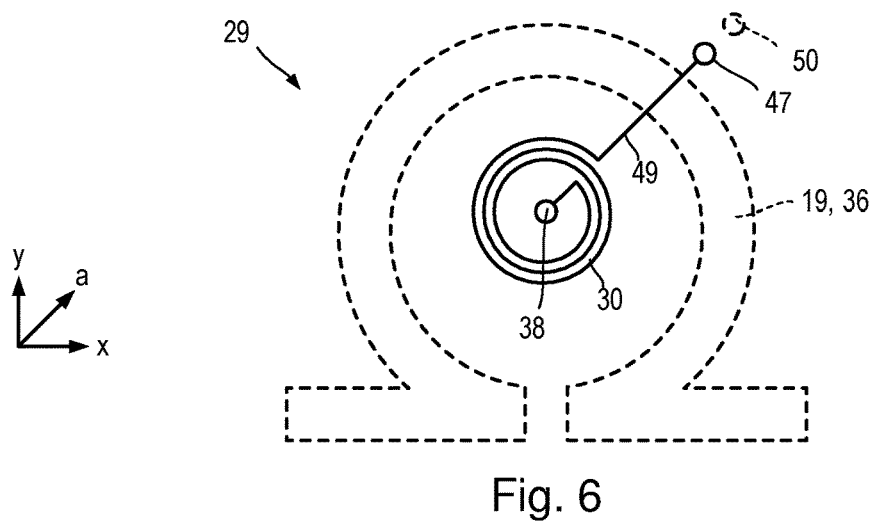
FIG. 6 is a plan view of a first conductive layer of a first multi-layer printed circuit board.
Figure 7:
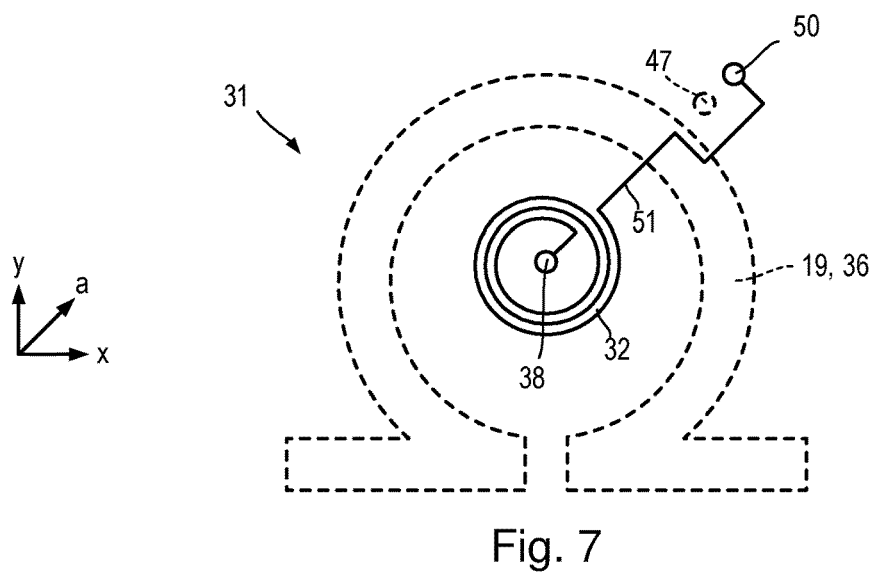
FIG. 7 is a plan view of a second conductive layer of a first multi-layer printed circuit board.

Referring also to FIGS. 5 to 7, layers of a first multi-layer printed circuit board 18 for use in the electricity meter 17 are shown.

Figure 8:
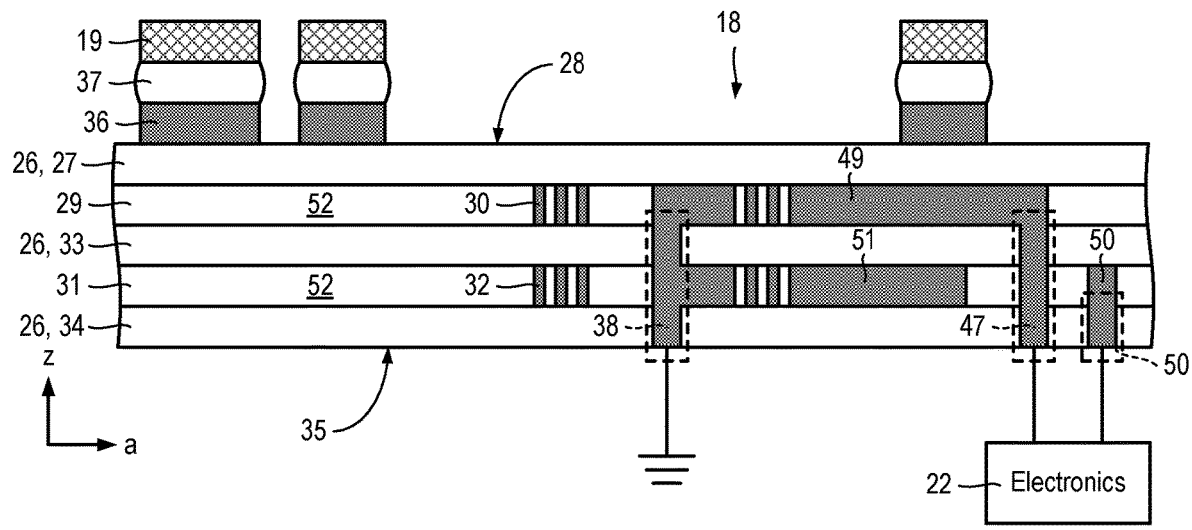
FIG. 8 is a cross-section of a first multi-layer printed circuit board attached to a conductor (busbar)

Referring also to FIG. 8, a cross-section along the line labelled A-A' in FIG. 5 is shown, for a situation in which the first multi-layer printed circuit board 18 is soldered to a conductor 19.

The electricity meter 17 includes a conductor 19 for transferring energy from a supply 20 to a load 21, and the first multi-layer printed circuit board 18 is mechanically attached to the conductor 19. Supply 20 may also be referred to as "Line". The conductor 19 may be a busbar. The electricity meter 17 also includes electronics 22 which process signals obtained from the first multi-layer printed circuit board 18 to determine and output a cumulative amount 23 of energy supplied to the load 21. The electronics 22 typically include one or more digital electronic processor(s) 24 and memory 25 storing instructions (not shown) for processing the signals obtained from the multi-layer printed circuit board 18.

The first multi-layer printed circuit board 18 includes two or more insulating layers 26, including a first insulating layer 26, 27 having an attachment surface 28 facing the conductor 19. The first multi-layer printed circuit board 18 also includes a first conductive layer 29 which includes a first planar sensor coil 30. The first insulating layer 26, 27 is arranged between the first conductive layer 29 and the conductor 19. The first multi-layer printed circuit board 18 also includes a second conductive layer 31 which includes a second planar sensor coil 31. The first multi-layer printed circuit board 18 also includes a second insulating layer 26, 33 arranged between the first and second conductive layers 29, 31. A third insulating layer 26, 34 is arranged between the second conductive layer 31 and a back surface 35 which is opposed to the attachment surface 28 across a thickness of the first multi-layer printed circuit board 18.

In the example shown in FIGS. 5 to 8, the first multi-layer printed circuit board 18 also includes a third conductive layer 26, 36 including a conductor track and disposed on the attachment surface 28 of the first insulating layer 26, 27. The conductor track 36 is mechanically and electrically attached to the conductor 19, in this example by solder 37. The primary function of the conductor track 36 is to permit strong mechanical attachment of the conductor using soldering or similar attachment methods. However, the conductor track 36 may also permit current flowing to/from the load 21 to run also through the conductor track 36, further reducing a distance in the thickness direction z to the planar sensor coils 30, 32. A thickness of solder between the conductor and the conductor track is preferably (though not essentially) less than or equal to 0.3 mm (0.012 inches) thick.

In general, reducing the thickness of the solder 37 is expected to increase the sensitivity of an inductive current sensor provided by the conductor 19 and first multi-layer printed circuit board 18. The solder 37 thickness between the conductor track 36 and the conductor (busbar) 19 may be less than 0.5 mm (0.020 inches), less than 0.3 mm (0.012 inches), or less than 0.2 mm (0.008 inches).

The use of solder 37 is not essential, and in other examples the conductor 19 may be electrically and mechanically attached to the conductor track 36 using any other suitable means including, but not limited to, brazing, welding, sintering or conductive adhesive(s). In other examples, the conductor 19 need not be electrically connected to the conductor track 36, and may be mechanically attached using non-conductive adhesive(s).

In general, the attachment surface 28 may be mechanically attached to the conductor 19 either indirectly, for example via the conductor track 36, or directly. For example, in other embodiments the conductor track 36 may be omitted, and the conductor 19 may instead by mechanically attached directly to the attachment surface 28 using, for example, adhesive.

The first planar sensor coil 30 and the second planar sensor coil 32 are electrically connected to one another through the second insulating layer 26, 33 by a first blind via 38 extending inwards from the back surface 35 of the first multi-layer printed circuit board 18. The first and second planar sensor coils 30, 32 may preferably be designed to improve immunity to external fields by matching the coils to reduce loop area. The first blind via 38 may be connected to system ground (or other reference potential) in order to permit a balanced measurement about system ground (or other reference potential).

Figure 9:
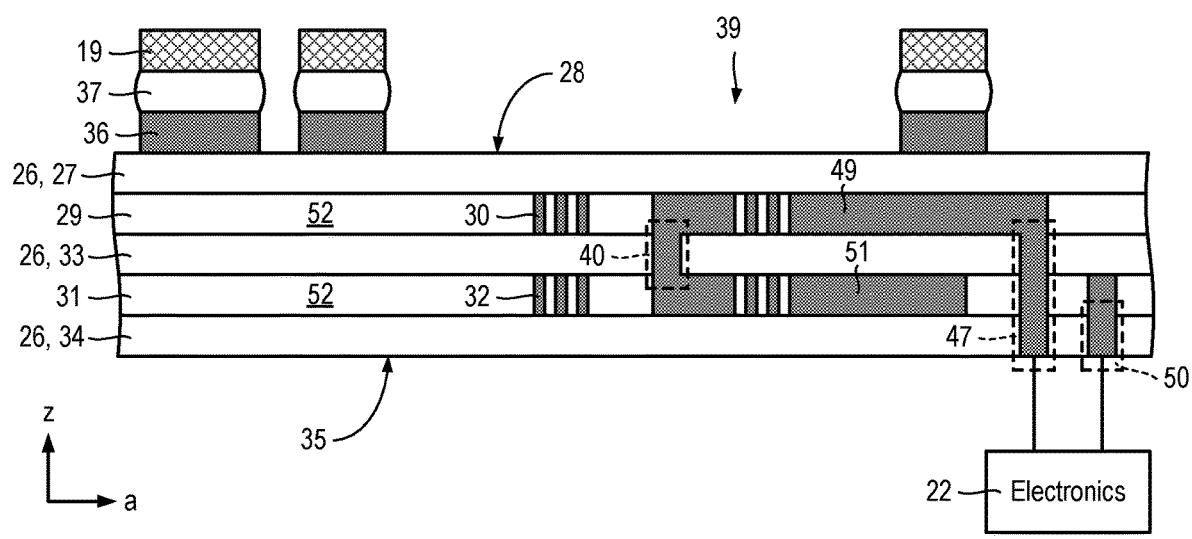
FIG. 9 is a cross-section of a second multi-layer printed circuit board attached to a conductor (busbar)

Referring also to FIG. 9, in another example of the electricity meter 17, a second multi-layer printed circuit board 39 is the same as the first multi-layer printed circuit board 18, except that the first planar sensor coil 30 and the second planar sensor coil 32 are electrically connected to one another through the second insulating layer 26, 33 by a first buried via 40. In the a second multi-layer printed circuit board 39 the centres of the planar sensor coils 30, 32 are not connected to system ground (or other reference potential). Instead, the electronics 22 obtain a differential measurement across the first and second planar sensor coils 30, 32 connected in series. The description 1o hereinafter may refer to either the first multi-layer printed circuit board 18 or the second multi-layer printed circuit board 39, unless specifically indicated otherwise.

In the first and second multi-layer printed circuit boards 18, 39, the blind via 38 or buried via 40 is encircled by each of the first and second planar sensor coils 30, 32, and each of the first and second planar sensor coils 30, 32 is formed as a spiral track. In practice, spiral tracks may be formed as a series of semi-circular segments of increasing diameter, rather than an ideal spiral.

The first and second planar sensor coils 30, 32 each have an effective magnetic centre, which is substantially coincident with an implied origin of the spiral. The effective magnetic centre of the first planar sensor coil 30 is substantially co-axial with the effective magnetic centre of the second planar sensor coil 32. Substantially co-axial means as co-axial as possible in practice, and may mean at least within 1 mm (0.039 inches) lateral separation. Preferably, the lateral separation is less than 0.2 mm (0.008 inches) or more preferably less than 0.1 mm (0.004 inches). The first planar sensor coil includes turns having a first sense of rotation which is clockwise about the common effective magnetic centre of the sensor coils (when viewed from the attachment surface 28 towards the back surface 35), and the second planar sensor coil includes turns having a second, anti-clockwise, sense of rotation about the common effective magnetic centre. Although shown as clockwise and anti-clockwise in FIGS. 6 and 7, the rotational directions of the first and second planar coils 30, 32 may be reversed.

The conductor 19 and the conductor track 36 have the same shape, and this will be described with reference in particular to FIG. 5 and the shape of the conductor track 36.

The conductor track 36 defines a loop or loop portion 41 having a first end 42 and a second end 43 separated by a gap 44. The loop portion 41 is an annular portion which, in this example, is substantially circular excepting the gap 44. Overall, the conductor track 36 defines an omega-shaped loop 41. The conductor 19 also includes a corresponding omega-shaped loop 41 having a first end 42 and a second end 43 separated by a gap (see FIG. 14). The loop 41 in the conductor 19 encloses a region 45, and the first and second planar sensor coils 30, 32 should be within, or at least partly within, the enclosed region 45. The first and second planar sensor coils 30, 32 are inductively coupled 46 to the conductor 19. Identical conductors 19 having omega-shaped loops 41 are soldered to the first multi-layer printed circuit board shown in FIGS. 5 to 8 and the second multi-layer printed circuit board 39 shown in FIG. 9.

In the examples of FIGS. 5 to 9, the conductors 19 and conductor tracks 36 include omega-shaped loops 41. However, other shapes of loop enclosing a region 45 may be used in other examples. The conductor 19 defines almost a full single turn for inductive coupling 46.

The first planar sensor coil 30 may be connected to the electronics 22 using a second blind via 47 extending inwards from the back surface 35. The second blind via 47 may connect to a conductive track or pad (not shown) disposed directly or indirectly on the back surface 35. The electronics 22, or at least part thereof, may be directly mounted on the back surface 35 to connect to the conductive track or pad. Alternatively, the electronics 22, or at least part thereof, may be directly mounted on a conductive layer 89 (FIG. 20) overlying the back surface 35 and providing one or more conductive tracks or pads. Alternatively, the second blind via 47 may connect to a connector 48 (FIG. 16) which permits a cabled/wired connection to electronics 22 situated away from the first or second multi-layer printed circuit board 18, 39. Although one end of the first planar sensor coil 30 could be directly connected to the second blind via 47, preferably the second blind via 47 is offset outside the projected area of the conductor 19 and connected to the first planar sensor coil 30 using a conductive track 49 of the first conductive layer 29.

The second planar sensor coil 32 may be connected to the electronics 22 using a third blind via 50 extending inwards from the back surface 35. The third blind via 50 may connect to a conductive track or pad (not shown) disposed on the back surface 35. The electronics 22 may be directly mounted on the back surface 35 to connect to the conductive track or pad. Alternatively, the third blind via 50 may connect to a connector 48 (FIG. 16) which permits a cabled/wired connection to electronics 22 situated away from the first or second multi-layer printed circuit board 18, 39. Although one end of the second planar sensor coil 32 could be directly connected to the third blind via 50, preferably the third blind via 50 is offset outside the projected area of the conductor 19 and connected to the second planar sensor coil 32 using a conductive track 51 of the second conductive layer 31.

In the examples shown in FIGS. 5 to 9, the common effective magnetic centre of first and second planar sensor coils 30, 32 is offset by an amount $d_{off}$ from a centre of the loop portion 41 of the conductor 19 (corresponding to loop portion 41 of the conductor track 36). Although drawn in FIG. 5 with offset $d_{off}$ in the positive direction y away from the gap 44, in practice the inventors have found that an offset in the negative direction y towards the gap 44 is optimal. The offset $d_{off}$ compensates for the effect of the omega-shape, which means that peak magnetic flux is not located at the implied centre of the loop portion 41. The offset $d_{off}$ places the effective magnetic centre of the first and second planar sensor coils 30, 32 at the point of maximum magnetic flux, increasing signal. Since the maximum of magnetic flux is also a stationary point, positioning the effective magnetic centre of the first and second planar sensor coils 30, 32 using the offset also minimises any loss of sensitivity arising from imperfect positioning of the first and second planar sensor coils 30, 32 during fabrication of the first or second multi-layer printed circuit boards 18, 39. The advantages of using an offset $d_{off}$ are discussed further in relation to FIG. 27.

The first and second multi-layer printed circuit boards 18, 39 may be assembled using conventional techniques for production of multi-layer printed circuits. For example, the conductor track 36 may be patterned onto the first insulating layer 26, 27, the first conductive layer 29 may be patterned onto the second insulating layer 26, 33 and the second conductive layer 31 may be patterned on the third insulating layer 26, 34. The first, second and third insulating layers 26, 27, 33, 34 may then be laminated together using adhesive 52. Alternatively, one of the insulating layers 26, 27, 33, 34 may be used as a substrate and the remaining layers built up layer-by-layer using suitable deposition techniques applied to one or both sides of such substrate. Alternatively, the first and multi-layer printed circuit boards 18, 39 may be fabricated using a combination of building up/depositing layers and lamination.

The insulating layers 26, 27, 33, 34 may be formed from any suitable insulating materials including, but not limited to, polymer impregnated glass fibre sheets, polymer sheets, and any other insulating materials known in the art of printed circuit boards. The thickness of the first insulating layer 26, 27 may be greater than or equal to 0.29 mm (0.011 inches). Other insulating layers 26, 33, 34 may be thinner, as the first insulating layer 26, 27 provides the primary isolation from the voltage of the conductor 19.

Conductive layers 29, 31, 36 of the multi-layer printed circuit boards 18, 39 may comprise non-magnetic plating, at least in a region corresponding to the conductor 19 and conductor track 36. For example, conductive layers 29, 31, 36 of the multi-layer printed circuit boards 18, 39 may be plated with silver, tin or other non-magnetic materials. In some examples, conductive layers 29, 31, 36 of the multi-layer printed circuit boards 18, 39 may be plated with immersion silver (IS). Conductive layers 29, 31, 36 of the multi-layer printed circuit boards 18, 39 may be formed of plated copper, or may include no copper at all—for example one or more of the conductive layers 29, 31, 36 may be deposited using immersion silver (IS). Typically, internal conductive layers such as the first and second conductive layers 29, 31 are not plated, and only external conductive layers such as the third conductive layer 36 are plated.

Conductive layers 29, 31, 36 of the multi-layer printed circuit boards 18, 39 preferably include no (or only impurities of) magnetic materials such as iron, nickel, cobalt and so forth. Conductive layers 29, 31, 36 of the multi-layer printed circuit boards 18, 39 are preferably not treated using hot air solder levelling (HASL) or electroless nickel immersion gold (ENIG) processes. Typically, HASL would not be applied to internal conductive layers such as the first and second conductive layers 29, 31. However, HASL treatment of the external conductive layers such as the third conductive layer 36 may be avoided for the first and second multi-layer printed circuit boards 18, 39.

The first planar sensor coil 30 and the second planar sensor coil 32 may be formed using a tracks having a width of less than or equal to 0.2 mm (0.008 inches), less than or equal to 0.15 mm (0.006 inches), or less than or equal to 0.1 mm (0.004 inches). Gaps between adjacent turns in the spiral of the first planar sensor coil 30 or second planar sensor coil 32 may be less than or equal to 0.2 mm (0.008 inches), less than or equal to 0.15 mm (0.006 inches), or less than or equal to 0.1 mm (0.004 inches).

In general, smaller track widths of the sensor coils 30, 32 and smaller gaps between adjacent turns of the sensor coils 30, 32 may improve sensor sensitivity because more turns can be fit onto a multi-layer printed circuit board 18, 39 having fixed size. This may increase the ease of use of the sensor and/or reduce the cost of materials.

Referring again to FIG. 4, the conductor 19 and multi-layer printed circuit board 18, 39 collectively form a mutual inductance current sensor, the sensitivity of which may preferably be at least 60 μV/A. Of course, the sensitivity of a mutual inductance current sensor formed by the conductor 19 and multi-layer printed circuit board 18, 39 may be adjusted to a desired value by changing parameters such as the number of turns of the planar sensor coils 30, 32, the thickness of the insulating layers 26, 27, 33, the width (track) and/or spacing (gap) of conductive tracks forming the planar sensor coils 30, 32, and so forth. In some examples, the sensitivity of the mutual inductance current sensor may be 50 μV/A, 100 μV/A, or 200 μV/A. In some examples, the sensitivity of the electricity meter 17 may be between 10 μV/A and 1000 μV/A.

Preferably, the electricity meter 17 meets American National Standards Institute, ANSI, requirements which are effective on the priority date of this specification, in particular UL-2735. Preferably, the electricity meter 17 meets European standards EN62053-31:2015 or EN50470-1:2006 as effective on the priority date of this specification. Preferably, the electricity meter 17 meets International Electrotechnical Commission, IEC, requirements which are effective on the priority date of this specification.

The use of blind or buried vias 38, 40 may be advantageous for reliably achieving a desired creepage distance $d_{creep}$. The creepage distance $d_{creep}$ is the shortest distance over the surface of the multi-layer printed circuit board 18, 39 between the conductor 19 (or conductor track 36) and an exposed electrical connection of the multi-layer printed circuit board 18, 39, for example a part of the electronics 22 and/or a connector 48 (FIG. 16) (see further discussion in relation to FIGS. 14 to 16).

Although known from large-scale and highly complex multi-layer circuit boards, blind or buried vias 38, 40 would not typically be used for a current sensor printed circuit board such as the first and second multi-layer printed circuit boards 18, 39, because these are relatively small in size (~32 mm/1.260 inches) and of low complexity. Blind or buried vias 38, 40 have been employed in the first and second multi-layer printed circuit boards 18, 39, at least in part, because of the inventor's realisation that this approach may be used to increase creepage distances $d_{creep}$ and high voltage standoff, without compromising magnetic performance. Consequently, the multi-layer printed circuit boards 18, 39 of the present specification may permit reductions in the size of inductive current sensors of an electricity meter 17, which may in turn reduce overall costs.

The robust mechanical attachment of the conductor 19 to the first or second multi-layer printed circuit boards 18, 39 may also be advantageous for mechanical stability of the electricity meter 17. Soldering 37, or comparable forms of mechanical attachment (see discussion hereinbefore) allows the multi-layer printed circuit boards 18, 39 of the present specification to remain in intimate attachment even when the conductor (busbar) 19 is distorted in use by misalignment with a receptacle socket (not shown) which receives the conductor 19 or by external clamping forces applied to the conductor 19.

Such intimate attachment to the multi-layer printed circuit board 18, 39 means dielectric isolation and/or the voltage standoff has to be managed by the multi-layer printed circuit board 18, 39 (soldered or otherwise mechanically attached to conductor 19) and in particular the first insulating layer 26, 27. Suitable insulating materials are available, for example polymer impregnated glass fibre layers, which may provide the desired isolation over a desired environmental range. The insulation may always be improved by increasing the thickness of the first insulating layer 26, 27. The isolation thickness provided by the first insulating layer 26, 27 may be greater than 1 mm (0.039 inches), greater than or equal to 0.6 mm (0.024 inches), greater than or equal to 0.5 mm (0.020 inches), or greater than or equal to 0.3 mm (0.012 inches). The isolation thickness required provided by the first insulating layer 26, 27 is dependent on the usage voltage of the conductor 19 and the standards and regulations which should be adhered to. Voltage standoffs of, for example, 4 kV 5 kV, 6 kV or 8 kV or more can be achieved using multi-layer printed circuit boards 18, 39 according to the present specification.

Configuring a multi-layer printed circuit board 18, 39 according to the present specification may permit the board size to be approximately 32.5 by 32.5 mm (1.280 by 1.280 inches) in size whilst still attaining sufficient sensitivity (in V/A) and creepage distance $d_{creep}$. The maximum length of a side of the multi-layer printed circuit board 18, 39 may be less than 26 mm (1.024 inches), less than 33 mm (1.299 inches), less than 40 mm (1.575 inches), or less than 50 mm (1.969 inches).

The maximum measurement current for a particular electricity meter 17 may typically be 20 A, 32 A, 80 A, 200 A, or 320 A, although other values are possible.

In general, improved current sensitivity of the electricity meter 17 may be achieved by minimising the thickness of the multi-layer printed circuit board 18, 39, for example to less than 0.9 mm (0.035 inches), less than 1 mm (0.039 inches), less than 1.2 mm (0.047 inches), less than 1.5 mm (0.059 inches), or less than 2 mm (0.079 inches). Using the teachings of the present specification to reduce the edge lengths of multi-layer printed circuit board 18, 39, whilst maintaining sufficient creepage distance $d_{creep}$, may make it easier to reduce a thickness of the multi-layer printed circuit board 18, 39.

Figure 10:
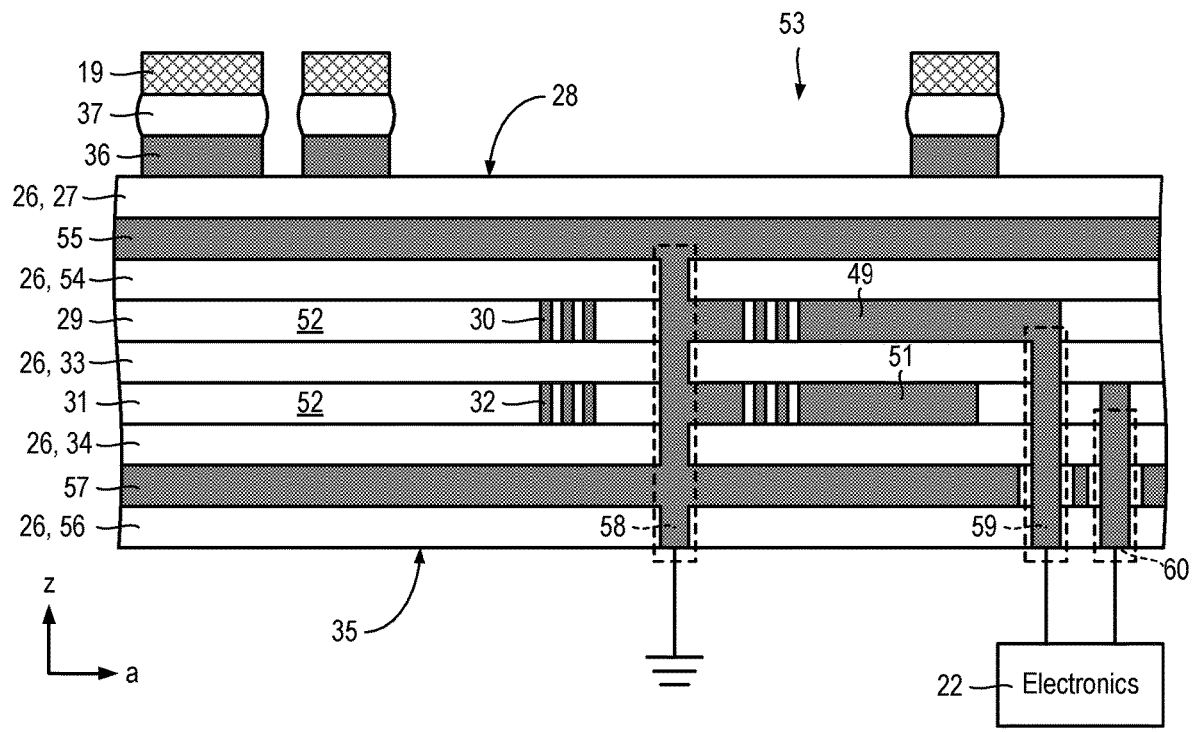
FIG. 10 is a cross-section of a third multi-layer printed circuit board attached to a conductor (busbar)

Referring also to FIG. 10, a third multi-layer printed circuit board 53 is shown.

The third multi-layer printed circuit board 53 includes all the same layers as the first multi-layer printed circuit board 18, and additionally includes a fourth insulating layer 26, 54 and a fourth conductive layer 55 stacked in order between the first conductive layer 29 and the first insulating layer 26, 27. The third multi-layer printed circuit board 53 also includes a fifth insulating layer 26, 56 and a fifth conductive layer 57 stacked in order between the back surface 35 (provided here by the fifth insulating layer 26, 56) and the third insulating layer 26, 34. The fourth and fifth conductive layers 55, 57 provide first and second electrostatic shields respectively. The centres of the planar sensor coils 30, 32 are connected to each other and to the electrostatic shields 55, 57 by a fourth blind via 58. The fourth blind 58 via is grounded (to system ground or other reference potential) to allow balanced measurements about ground (or other reference potential). The connection of the electrostatic shields 55, 57 to ground (or other reference potential) shields the planar sensor coils 30, 32 from capacitive coupling to the general alternating current (AC) signal in the conductor 19, reducing noise.

The other ends of the first and second planar sensor coils 30, 32 are respectively connected to the electronics 22 (or a connector 48) through fifth and sixth blind vias 59, 60 extending inwards from the back surface 35. The second electrostatic shield 57 includes gaps to permit passage of the fifth and sixth blind vias 59, 60 whilst maintaining electrical isolation. The electrostatic shields 55, 57 do not extend up to the outer edges (in the x, y plane) of the third multi-layer printed circuit board 53, in order to maintain the maximum possible creepage distance $d_{creep}$.

Preferably, both electrostatic shields 55, 57 are included. However, if the primary source of interference through capacitive coupling is from the conductor 19, then the fifth conductive layer 57 providing the second electrostatic shield 57 and the associated fifth insulating layer 26, 56 could be omitted.

Figure 11:
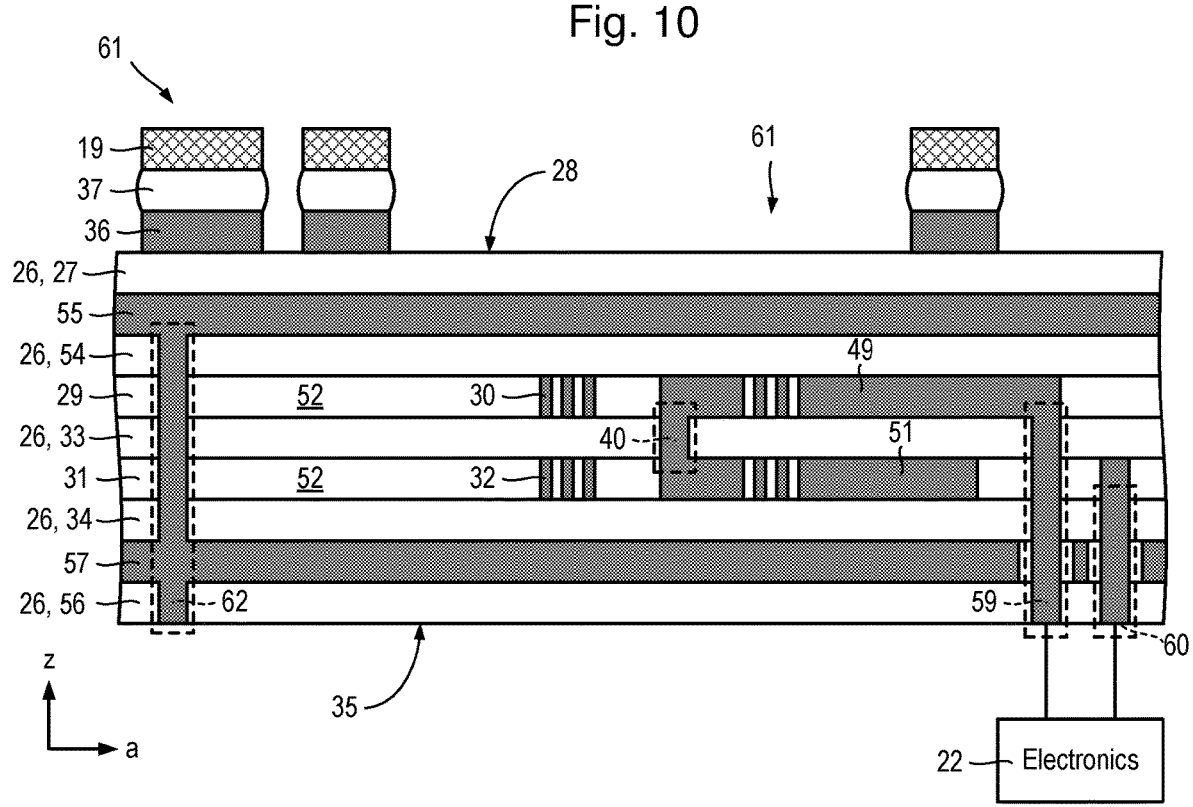
FIG. 11 is a cross-section of a fourth multi-layer printed circuit board attached to a conductor (busbar)

Referring also to FIG. 11, a fourth multi-layer printed circuit board 61 is shown.

The fourth multi-layer printed circuit board 61 is the same as the third multi-layer printed circuit board 53, except that the first and second planar sensor coils 30, 32 are connected at their centres using the first buried via 40 passing through the second insulating layer 26, 33, and that the electrostatic shields 55, 57 are connected together and to ground (or connected to another reference voltage) though a seventh blind via 62 extending inwards from the back surface 45.

Equally, the fourth multi-layer printed circuit board 61 is the same as the second multi-layer printed circuit board 39, with the addition of the electrostatic shields 55, 57 and associated fourth and fifth insulating layers 26, 54, 56, the seventh blind via 62, and the replacement of second and third blind vias 47, 50 with fifth and sixth blind vias 59, 60.

Preferably, both electrostatic shields 55, 57 are included. However, if the primary source of interference through capacitive coupling is from the conductor 19, then the fifth conductive layer 57 providing the second electrostatic shield 57 and the associated fifth insulating layer 26, 56 could be omitted.

Figure 12:
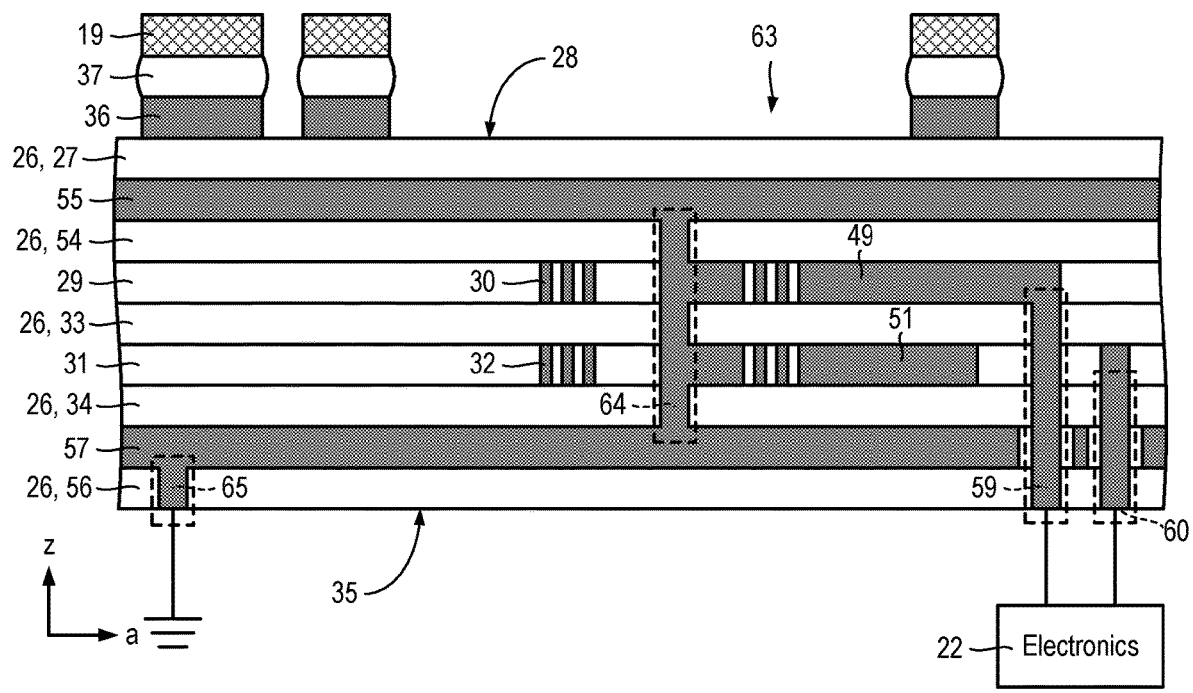
FIG. 12 is a cross-section of a fifth multi-layer printed circuit board attached to a conductor (busbar)

Referring also to FIG. 12, a fifth multi-layer printed circuit board 63 is shown.

The fifth multi-layer printed circuit board 63 is the same as the third multi-layer printed circuit board 53, except that the first and second planar sensor coils 30, 32 are connected to each other and to the first and second electrostatic shields 55, 57 by a second buried via 64. The second electrostatic shield 57 is connected to ground (or another reference potential) through an eighth blind via 65 which extends from the back surface 35 at a position laterally offset from the second buried via 64.

Preferably, both electrostatic shields 55, 57 are included. However, if the primary source of interference through capacitive coupling is from the conductor 19, then the fifth conductive layer 57 providing the second electrostatic shield 57 and the associated fifth insulating layer 26, 56 could be omitted and the eighth via 65 could extend to the first electrostatic shield 55.

Figure 13:
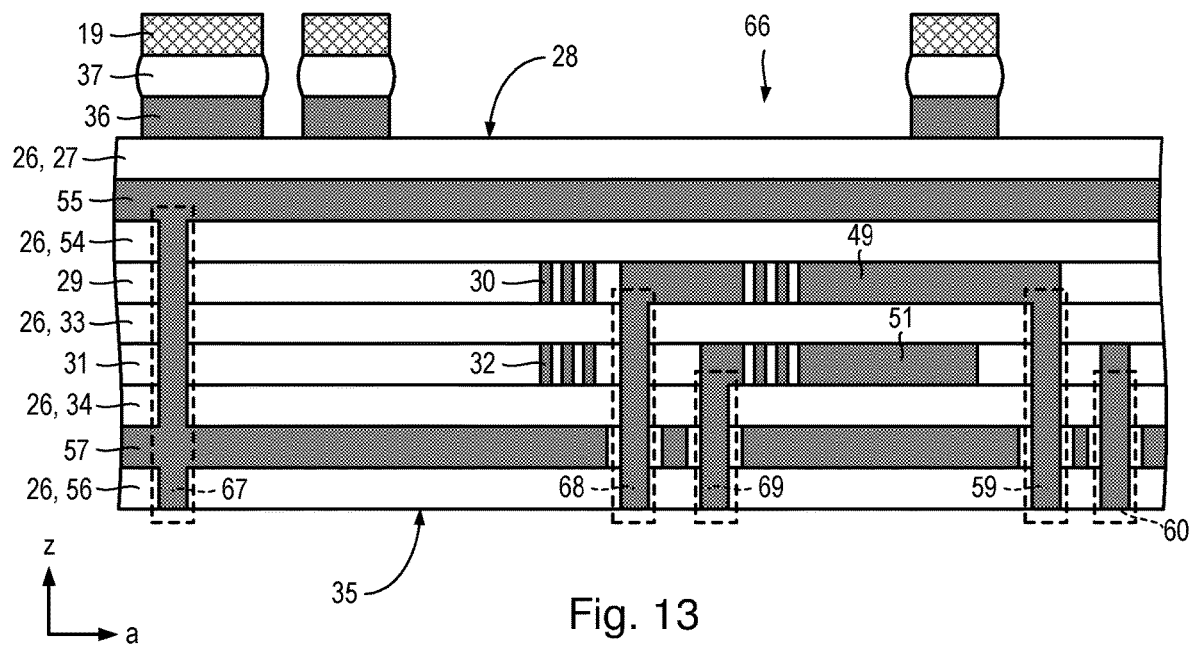
FIG. 13 is a cross-section of a sixth multi-layer printed circuit board attached to a conductor (busbar)

Referring also to FIG. 13, a sixth multi-layer printed circuit board 66 is shown.

The sixth multi-layer printed circuit board 66 is similar to the third to fifth multi-layer printed circuit boards 53, 61, 63, and includes the same conductive and insulating layers. The sixth multi-layer printed circuit board 66 differs in the configuration of vias employed. The first and second electrostatic shields 55, 57 are connected to one another by a ninth blind via 67 extending inwards from the back surface 35. The centres of the first and second planar sensor coils 30, 32 are contacted using respective, separate tenth and eleventh blind vias 68, 69 extending inwards from the back surface 35. The other ends of the first and second planar sensor coils 30, 32 are contacted using the fifth and sixth vias 59, 60 in the same way as for the third to fifth multi-layer printed circuit boards 53, 61, 63. The second electrostatic shield 57 includes gaps to allow passage of the tenth and eleventh blind vias 68, 69 whilst maintaining electrical isolation.

The sixth multi-layer printed circuit board 66 allows the connections to the first and second planar sensor coils 30, 32 to be made externally to the sixth multi-layer printed circuit board 66, which provides improved flexibility by allowing either balanced or differential measurements in dependence on how the fifth, sixth, tenth and eleventh blind vias 59, 60, 68, 69 are connected to electronics 22.

Figure 14:
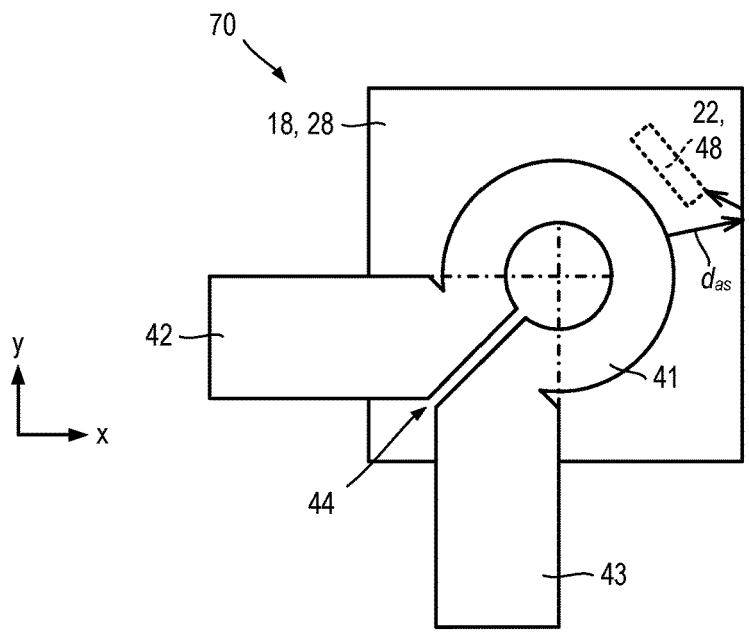
FIG. 14 is a plan view of an inductive current sensor, illustrating a minimum creepage distance to a conductive element positioned on a back surface of a multi-layer printed circuit board.

Referring also to FIG. 14, a plan view of a mutual inductance current sensor 70 formed by attaching the first multi-layer printed circuit board 18 to the conductor 19 is shown.

Figure 15:
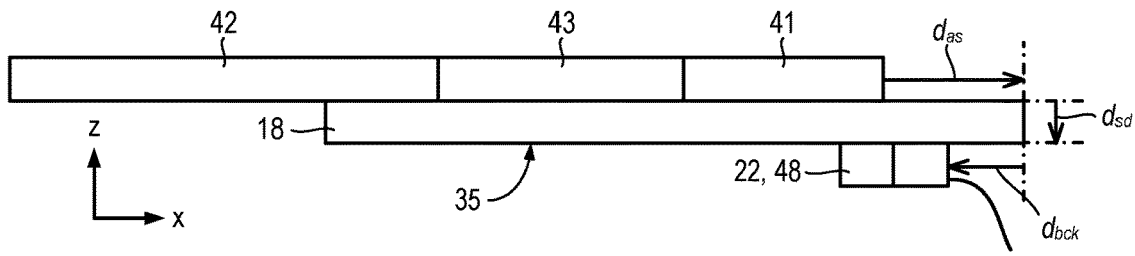
FIG. 15 is a side view of an inductive current sensor, illustrating a minimum creepage distance to a conductive element positioned on a back surface of a multi-layer printed circuit board.

Referring also to FIG. 15, a cross-sectional view of a mutual inductance current sensor 70 formed by attaching the first multi-layer printed circuit board 18 to the conductor 19 is shown.

Figure 16:
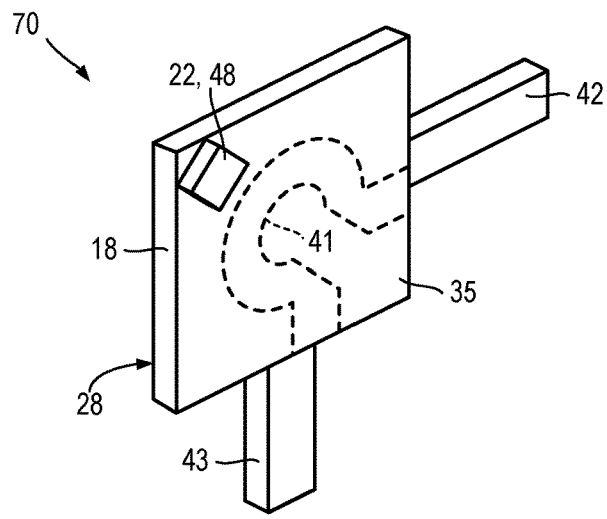
FIG. 16 is a projection view of an inductive current sensor.

Referring also to FIG. 16, a perspective view of a mutual inductance current sensor 70 formed by attaching the first multi-layer printed circuit board 18 to the conductor 19 is shown.

Figure 26:
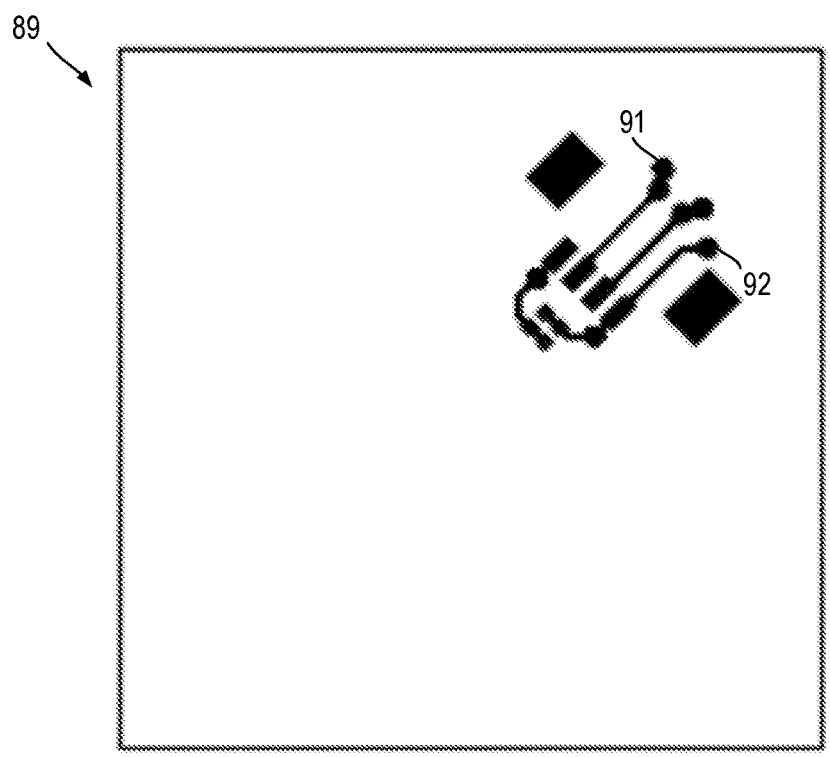
FIG. 26 is a plan view of a sixth conductive layer of the seventh multi-layer printed circuit board, providing pads and tracks for connecting blind vias to connector(s) and/or electronics.

Components, for example at least some components of the electronics 22 or connector(s) 48, are mounted directly or indirectly to the back surface 35. The back surface 35 may support a further conductive layer (for example the sixth conductive layer 89 shown in FIGS. 20 and 26). Such components may be directly connected to blind vias 38, 47, 40, 58, 59, 60, 62, 64, 65, 67, 68, 69 (e.g. positioned over them) or connected to blind vias 38, 47, 40, 58, 59, 60, 62, 64, 65, 67, 68, 69 using one or more conductive tracks (see FIG. 26) disposed on the back surface 35 in a further conductive layer (for example the sixth conductive layer 89 shown in FIGS. 20 and 26).

The connector(s) 48 may be configured to receive one or more wires, a coaxial cable, a flexible flat cable (FFC), or any other suitable type of cable for electrical connection to electronics 22 which are provided separately from the inductive current sensor 70.

Figure 17:
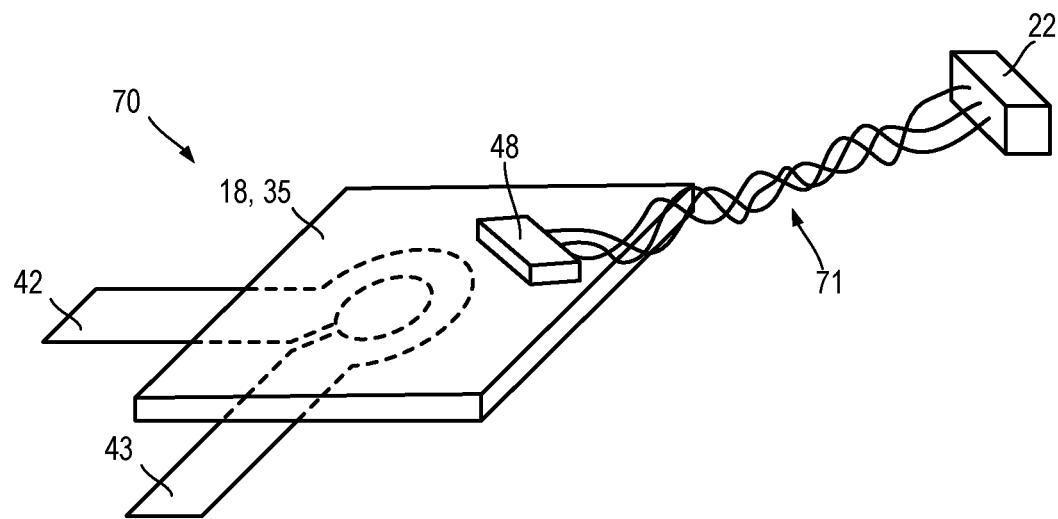
FIG. 17 illustrates connecting a multi-layer printed circuit board using multiple insulated wires.

Referring also to FIG. 17, connection is illustrated using multiple insulated wires 71, twisted together to reduce electrical and/or magnetic coupling to external fields.

The multiple insulated wires 71 may be part of a separate cable loom with connector(s) (such as the Molex® type) used to connect to a connector 48 on the first multi-layer printed circuit board 18 and a corresponding connector (not shown) forming part of the electronics 22.

Figure 18:
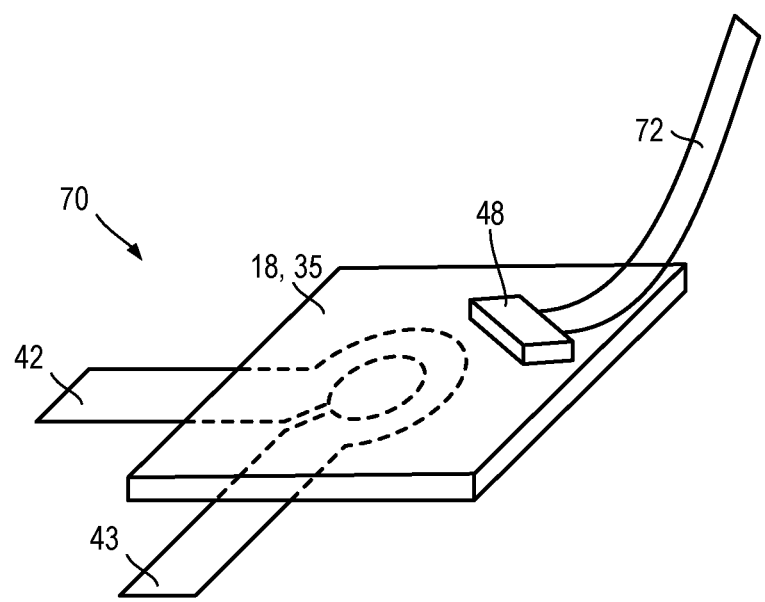
FIG. 18 illustrates connecting a multi-layer printed circuit board using a flexible flat cable.

Referring also to FIG. 18, connection using a flexible flat cable (FFC) 72 is illustrated.

Alternatives to multiple insulated wires 71 or flexible flat cable (FFC) 72 include, but are not limited to, one or more coaxial cables.

The total creepage distance $d_{creep}$ includes a first distance $d_{as}$ across the attachment surface, a second distance $d_{sd}$ down a side edge of the first multi-layer printed circuit board 18, and a third distance $d_{bck}$ across the back surface 35:

$$d_{creep} = d_{as} + d_{sd} + d_{bck}$$

In this way, the configuration of the first multi-layer printed circuit board 18 enables a compact and lower cost mutual inductance current sensor 70 to be produced, without sacrificing creepage specifications. Indeed, the configuration of the first multi-layer printed circuit board 18 may even enable a mutual inductance current sensor 70 to be reduced in size whilst increasing the creepage distance $d_{creep}$.

The minimum creepage distance $d_{creep}$ will depend on the voltages used, and may be at least 5 mm (0.197 inches), at least 7 mm (0.276 inches), at least 8 mm (0.315 inches), at least 9.535 mm (⅜ inch) at least 10 mm (0.394 inches), at least 15 mm (0.591 inches) or at least 20 mm (0.787 inches), depending on the operating voltage of the conductor 19 and other factors such as intended operating environments (e.g. humidity, cleanliness) and so forth. A minimum creepage distance $d_{creep}$ may often be set by national standards bodies, for example, the creepage $d_{creep}$ and clearance distance for American National Standards Institute (ANSI) electricity meters is defined by standard UL2735. As another example a 9.4 mm (0.370 inches) creepage distance $d_{creep}$ is sufficient for a conductor operating at 480V, and is readily achievable using the first multi-layer printed circuit board 18.

Preferably, components of the electronics 22 and/or connector(s) 48 are positioned so as not to overlap a projected area of the conductor 19. This may be a requirement if any of the components and/or connectors 22, 48 include magnetically active materials such as, for example, conductors formed of, or coated with, magnetic materials such as iron (steel), nickel and so forth.

However, the inventors have surprisingly found that components 22, 48 including magnetically active materials may be located closer to the projected outer periphery of the conductor than was expected. In particular, components 22, 48 including magnetically active materials may be supported on the back surface so as to be within 3 mm (0.118 inches), within 2 mm (0.079 inches) or even within 1 mm (0.039 inches) from a projected outer periphery of the conductor 19. For example, if a diameter of an omega-shaped loop of the conductor 19 is 19 mm (0.748 inches) then the components should be outside a diameter of 13 mm (0.512 inches) if the within 3 mm (0.118 inches) distance is used. Without wishing to be bound by theory, it is believed that the cause of this surprising result is that the magnetic field of the conductor 19 falls off surprisingly rapidly with distance (see further discussion in relation to FIG. 29 hereinafter). This result may allow a total creepage distance $d_{creep}$ to be maximised, whilst avoiding excessive perturbation of the magnetic flux generated by the conductor 19.

Figure 20:
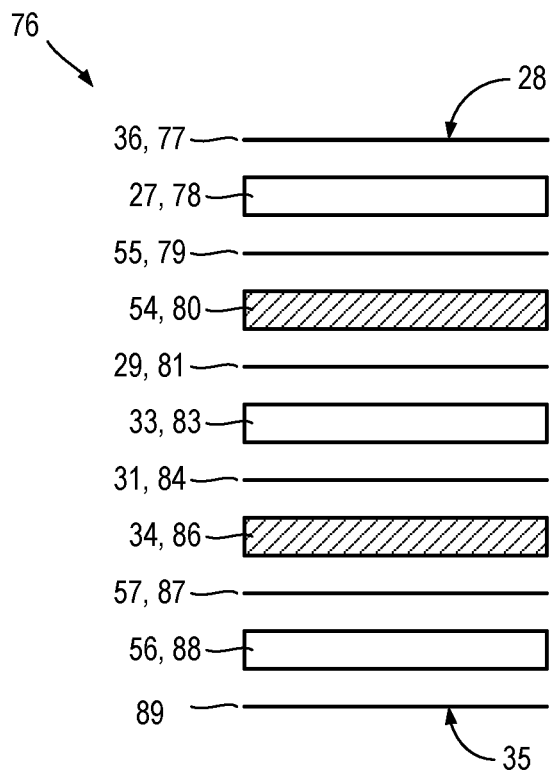
FIG. 20 is a cross-section of a seventh multi-layer printed circuit board including six conductive layers.
Figure 21:
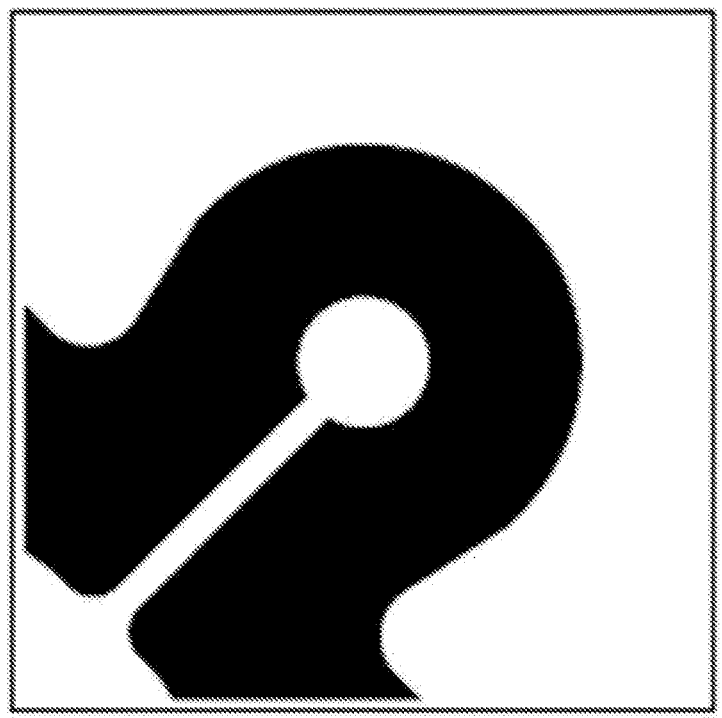
FIG. 21 is a plan view of a third conductive layer of the seventh multi-layer printed circuit board, for soldering to a conductor (busbar) and having no connection to any inner layers of the seventh multi-layer printed circuit board.

Although illustrated in relation to the first multi-layer printed circuit board 18, the inductive current sensor 70 may alternatively include any one of the second to seventh multi-layer printed circuit boards 39, 53, 61, 63, 66, 76 (FIG. 20).

Figure 19:
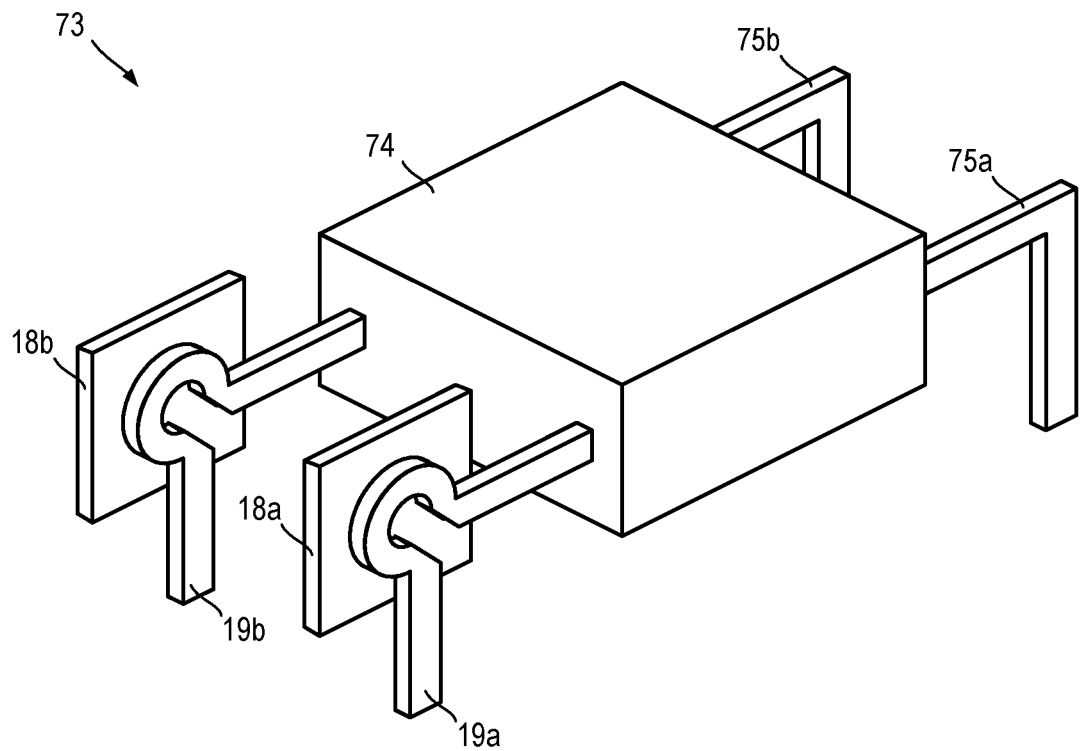
FIG. 19 is a projection view of a second electricity meter.

Referring also to FIG. 19, a second electricity meter 73 is shown.

The second electricity meter 73 is the same as the electricity meter 17, except that the second electricity meter 73 includes first and second conductors 19a, 19b, each attached to a corresponding first multi-layer printed circuit board 18a, 18b and corresponding to a separate supply 20. For example, the first and second conductors 19a, 19b may be connected to different phase components of a multi-phase mains electricity distribution network. Onward conductors 75a, 75b are used for connecting to one or more loads 21, and may be directly or indirectly coupled to the respective first and second conductors 19a, 19b.

An optional casing 74 may help to support the conductors 19a, 19b and connections to onward conductors 75a, 75b. The casing 74 may optionally include one or more switches for connecting the conductors 19a, 19b to the onward conductors 75a, 75b.

Although shown mechanically attached to the first and second conductors 19a, 19b on the supply 20 side, the first multi-layer printed circuit boards 18a, 18b may alternatively be mechanically attached to the onward conductors 75a, 75b on the load 21 side (in such an example the onward conductors 75a, 75b would additionally include omega-shaped loops 41). The multi-layer printed circuit boards 18a may alternatively be mechanically attached to the opposite side of the conductor 19a to improve ease of attachment.

Although illustrated in relation to the first multi-layer printed circuit board 18, the second electricity meter 73 may alternatively include any one of the second to seventh multi-layer printed circuit boards 39, 53, 61, 63, 66, 76 (FIG. 20).

Although two conductors 19a, 19b have been illustrated, an electricity meter may contain any number of conductors 19 for transferring energy from a supply 20 to corresponding load 21, and each conductor 19 (or onward conductor 75) may be mechanically attached to a corresponding multi-layer printed circuit board 18, 39, 53, 61, 63, 66, 76 (FIG. 20).

Seventh Multi-Layer Printed Circuit Board

Referring also to FIGS. 20 to 26, principles of the present specification may be further understood with reference to a specific worked example in the form of a seventh multi-layer printed circuit board 76.

The description of the seventh multi-layer printed circuit board 76 is not intended to limit the preceding general description of the first to sixth multi-layer printed circuit board 18, 39, 53, 61, 63, 66. Furthermore, any principles and/or features of the first to sixth multi-layer printed circuit boards 18, 39, 53, 61, 63, 66 should be considered to be applicable to the seventh multi-layer printed circuit board 76, and vice versa, unless indicated otherwise, or self-evidently incompatible.

The seventh multi-layer printed circuit board 76 includes, stacked in order between the attachment surface 28 and the back surface 35, a third conductive layer 36, 77 defining a conductor track, a first insulating layer 27, 78, a fourth conductive layer 55, 79 defining the first electrostatic shield, a fourth insulating layer 54, 80, a first conductive layer 29, 81 defining a first planar sensor coil 30, 82, a second insulating layer 33, 84, a second conductive layer 31, 84 defining a second planar sensor coil 32, 85, a third insulating layer 34, 86, a fifth conductive layer 57, 87 defining the second electrostatic shield, a fifth insulating layer 56, 88 and a sixth conductive layer 89 defining conductive tracks (FIG. 26) for connected to electronics 22 and/or connector(s) 48.

In the seventh multi-layer printed circuit board 76, via 90 connecting the first and second planar sensor coils 82, 85 may be a buried via similar to the first or second buried vias 40, 64, or a blind via similar to the first or fourth blind vias 38, 58. Vias 91, 90 connecting to the other ends of the first and second planar sensor coils 82, 85 may be configured as described in relation to the fifth and sixth blind vias 59, 60.

Figure 23:
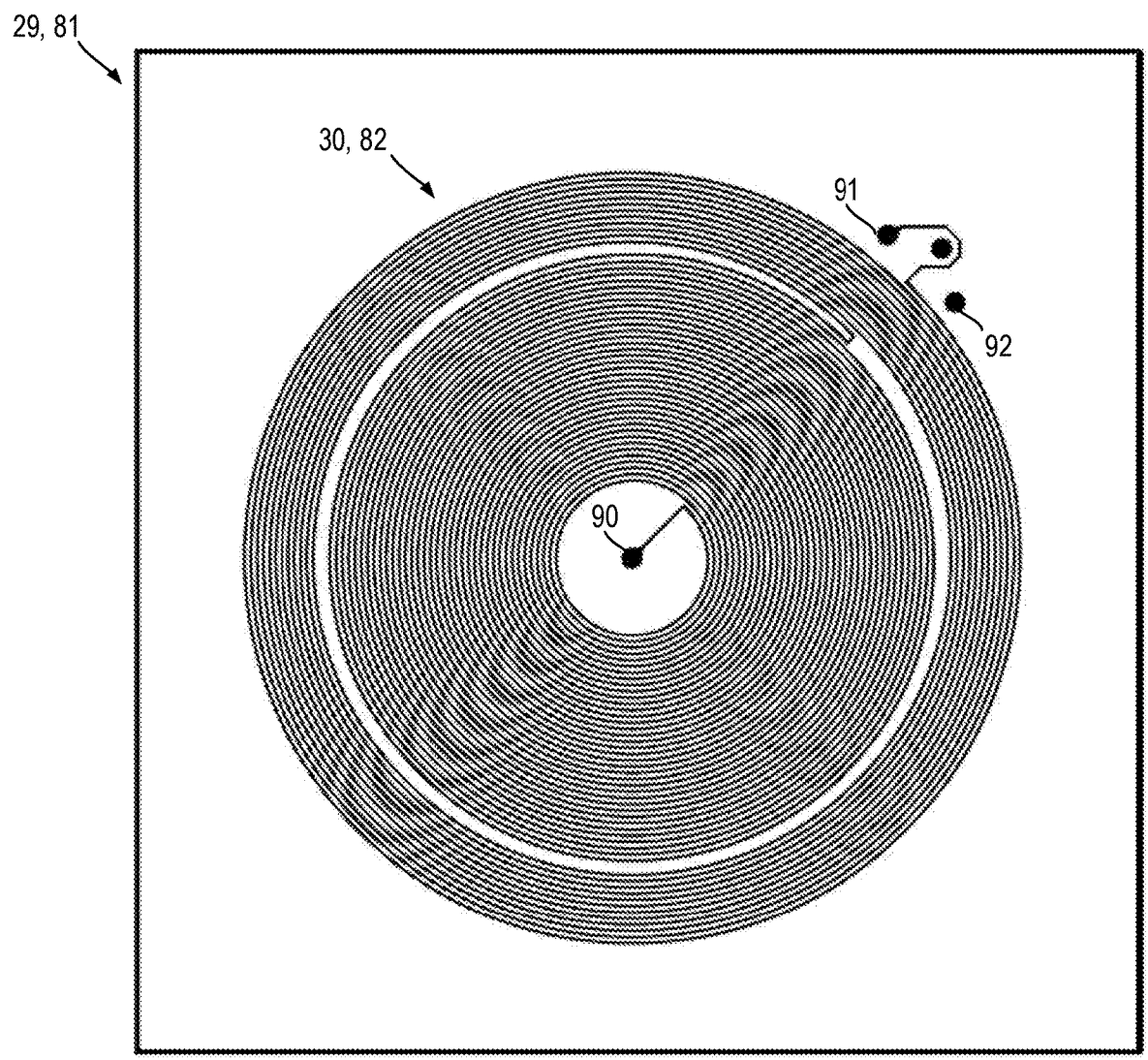
FIG. 23 is a plan view of a first conductive layer of the seventh multi-layer printed circuit board, providing a first planar sensor coil.
Figure 24:
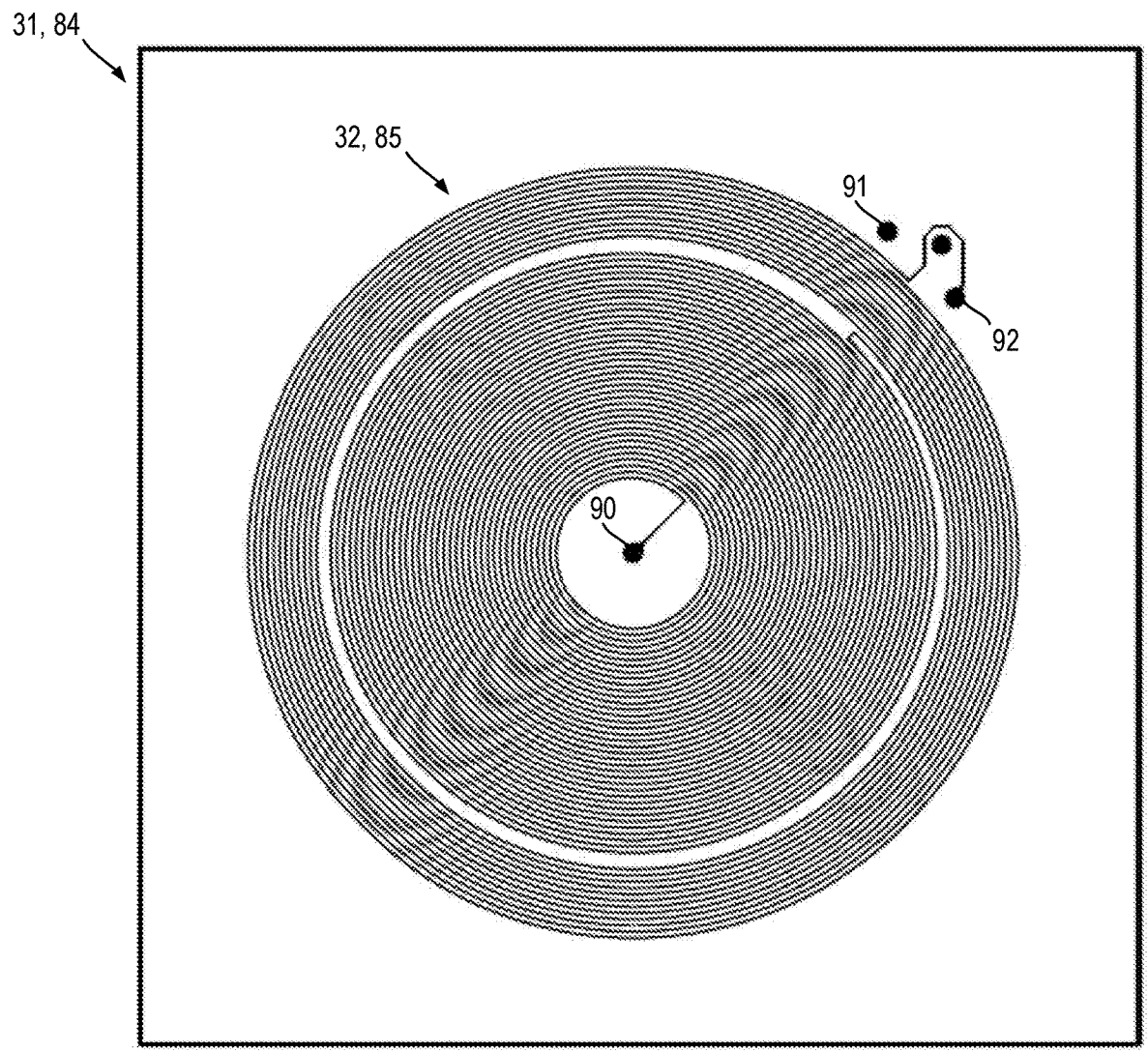
FIG. 24 a plan view of a second conductive layer of the seventh multi-layer printed circuit board, providing a second planar sensor coil.

In addition to and/or instead of the described vias 90, 91, 92 the seventh multi-layer printed circuit board 76 may include additional and/or alternative blind vias and/or buried via(s) (similar to those shown in FIG. 3) for the connections between different conductive layers 79, 81, 83, 85, 87 and between the first and second planar sensor coils 30, 77, 32, 78 (shown in FIG. 23 and FIG. 24). Buried or blind vias may be within conductive regions of some conductive layers 79, 81, 83, 85, 87 and isolated from conductive regions of other conductive layers 79, 81, 83, 85, 87 through which they pass.

The use of blind or buried vias is advantageous over coating a through-hole, as it is easier to reliably achieve the desired creepage distance and voltage standoff. Although blind/buried vias are not normally used on a board of this small size and low complexity, however in the seventh multi-layer printed circuit board 76 the inventors have realised that it offers specific advantages of being able to combine magnetic performance, high voltage standoff, compact multi-layer printed circuit board 76, compact Omega-shaped conductor 19 (busbar), large creepage distance $d_{creep}$, and extreme mechanical stability of assembly outlined in this disclosure (e.g. mechanical stability of electricity meters 17, 73 and/or mutual inductance current sensors 70).

A cost effective way to achieve attachment between the conductor (busbar) 19 and the seventh multi-layer printed circuit board (PCB) 76 is to solder (e.g. by a reflow process) the conductor (busbar) 19 to a pad in the form of conductor track 36, 77 (FIG. 21) on the attachment surface 28 of the sensor PCB 77 (the PCB 76 contains the first and second sensor coils 82 and 85). The printed circuit board (PCB) material (such as high temperature grade FR4, but not limited to FR4) provides mechanical stability and electrical isolation. This allows the sensor PCB 76 to remain in intimate attachment even when the conductor (busbar) 19 is distorted in use by misalignment with a receptacle socket (not shown) or by external clamping forces. This intimate attachment to the PCB 76 means dielectric isolation has to be managed by the PCB 76 (e.g. a substrate, in particular the first insulating layer 27, 78). Suitable PCB substrate materials are available that give high and reliable isolation over the desired environmental range given sufficient thickness of the substrate (i.e. the distance between the outer face of the sensor PCB 76 attached to conductor (busbar) 19 and any tracks (for sensor coils 82, 85 or electrostatic screens 79, 87 or other tracks) inside PCB 76. The isolation thickness may be more than 1 mm (0.039 inches), or more than or equal to 0.6 mm (0.024 inches), or more than 0.5 mm (0.020 inches), or more or equal to 0.3 mm (0.012 inches). The isolation thickness required is dependent of the voltage of the conductor 19 and the standards and regulations applied. Voltage standoffs i.e. 4 kV 5 kV, 6 kV or 8 kV or more can be achieved.

The first and second planar sensor coils 82 and 85 are designed to improve immunity to external fields by reducing loop area by matching the coils.

Referring in particular to FIG. 23, the first planar sensor coil 83 includes a first number $N_1$ of turns having a first sense of rotation (clockwise in FIG. 23), and a second number of turns $N_2$ connected in series with the first number of turns $N_1$, the second number of turns $N_2$ having a second, opposite sense of rotation (anti-clockwise in FIG. 23).

The first number of turns $N_1$ provide detection coils to detect current in the conductor 19, and typically lie beneath the loop portion 41 of the conductor 19. The second number of turns $N_2$ provide corresponding cancellation portions, and typically lie outside a projected area of the loop portion 41 of the conductor 19. The voltages induced in the first and second number of turns $N_1$, $N_2$ will have opposite polarities. The turn-area products of the first and second number of turns $N_1$, $N_2$ are configured so that magnetic flux due to currents in the conductor 19 will produce a net potential, whereas magnetic flux from other, more distant sources will be cancelled out (or at least reduced in magnitude). Cancellation may be realised for uniform or linearly varying external magnetic fields, or external magnetic fields which are varying sufficiently slowly with distance as to be approximated as uniform or linearly varying. For more detailed discussion of the cancellation effect using such sensor coils, we refer to U.S. Pat. No. 6,414,475 B1 by Dames et al.

Referring in particular to FIG. 24, the second planar sensor coil similarly includes a third number $N_3$ of turns having the second sense of rotation (anti-clockwise in FIG. 24) connected in series with a fourth number $N_4$ of turns having the first sense of rotation (clockwise in FIG. 24). The turn-area products of the third and fourth number of turns $N_1$, $N_2$ are similarly configured for cancellation, or at least reduction of, signals due to external sources of magnetic flux.

The PCB 76 board size may be approximately 32.5 by 32.5 mm (1.280 by 1.280 inches) in size and still attain the sensitivity (V/A) and the desired creepage distance $d_{creep}$. The maximum length of a side of the PCB 76 may be less than 26 mm (1.024 inches) or less than 33 mm (1.299 inches) or less than 40 mm (1.575 inches), or less than 50 mm (1.969 inches). The omega-shaped loop portion 41 of the conductor 19 has an outer radius of approximately 9.5 mm (0.374 inches) and an inner diameter of approximately 7 mm (0.276 inches).

The sensor PCB 76 may have two layers of sensor coils 82, 85 (shown in FIGS. 24 and 24) or four layers of coils (not shown) or even more layers of coils (not shown). For more than two coils 82, 85, the coils may all be connected in series, with the sense of rotation reversing upon each transition to a new conductive layer. The number of coils increases the sensor's sensitivity which may be necessary if reduced measurement currents need to be accommodated. The maximum measurement current for a particular sensor may typically be 20 A, 32 A, 80 A, 200 A, 320 A but other values are possible.

The solder thickness between the pad of the conductor track 36, 77 (FIG. 21) and the Omega-shaped conductor 19 (busbar) may be less than 0.5 mm (0.020 inches), or less than 0.3 mm (0.012 inches), or less than 0.2 mm (0.008 inches). Reducing the thickness of the solder may increase the sensitivity of the current sensor.

The sensor PCB 76 uses a minimum track (width of conduction tracks on PCB) and minimum gap (width between conduction tracks) on the PCB 76 of 0.2 mm (0.008 inches) or less than 0.2 mm (0.008 inches), or 0.1 mm (0.004 inches) track and gap, or less than 0.1 mm (0.004 inches) track and gap. Smaller track and gaps can improve sensor sensitivity as more turns can be achieved in a compact PCB 76, thus increasing the ease of use of the sensor and reducing the cost of material.

Improved sensor sensitivity is also achieved by minimising the sensor PCB 76 board thickness<0.9 mm (0.035 inches), or <1 mm (0.039 inches), or <1.2 mm (0.047 inches), or <1.5 mm (0.059 inches), <2 mm (0.079 inches). Having a small PCB 76 board may make it easier to reduce thickness.

The sensitivity may be approximately 50 microvolts per amp, 100 microvolts per amp, or 200 micro volts per amp or between 10 micro volts/amp and 1000 micro volts per amp.

In an embodiment which covers maximum current of 200 A and 320 A a 32.5×32.5 mm (1.280 by 1.280 inch) board can achieve approximately 100 microvolts per amp using two coils layers 82 and 85. In a 20 A application 200 microvolts per amp may be achieved when four coil layers are employed (not shown).

Referring again to FIGS. 14 to 18, any components 22, 48, such as, but not limited to the connector 48 mounted to the PCB 76 are spaced away from the centre of the Omega-shape of the conductor 19 to reduce the effect of ferromagnetic components on the linearity of the sensor performance especially at high currents. The magnetic field generated around the Omega-shaped conductor 19 which reacts with any ferromagnetic components falls away surprisingly quickly with radial distance from the Omega-shaped loop portion 41. The components 22, 48 mounted on the sensor PCB 76 on the opposite side to the copper Omega-shaped conductor 19 should preferentially not be mounted over the bus bar copper or less than 1 mm (0.039 inches), less than 2 mm (0.079 inches), or less than 3 mm (0.118 inches) within the projection of the periphery of the Omega-shaped loop portion 41 in the copper conductor (busbar) 19.

The PCB 76 may preferentially not use a ferromagnetic finish such as electroless nickel immersion gold (ENIG), as it may cause non-linearity of the sensor especially at elevated currents. Plating, such as Immersion Silver (IS), is preferable as it is not magnetic and is flat which improves the quality of the solder joint and the parallel alignment of the sensor PCB 76 and the conductor (busbar) 19.

Referring in particular to FIGS. 5, 23 and 24, it was found that the common central axis of the sensor coils 82, 85 within the sensor PCB 76 should be offset from the centre of the Omega-shaped loop portion 41 of the conductor 19 (and the corresponding Omega of the conductor track 36) by offsetting the central axis of the coils 82, 85 by around 0.4 mm (0.016 inches) from the centre of the Omega-shaped loop portion 41 towards the gap (slot) 44 in a radial direction coincident with the central axis of the gap (slot) 44 to maximise the sensitivity of the sensor PCB 76/conductor (busbar) 19 assembly, and to reduce the change of sensitivity associated with errors in the mounting position of the sensor PCB 76 in the major plane (in the x, y plane) of the PCB 76 relative to the Omega-shaped loop portion 41.

Figure 22:
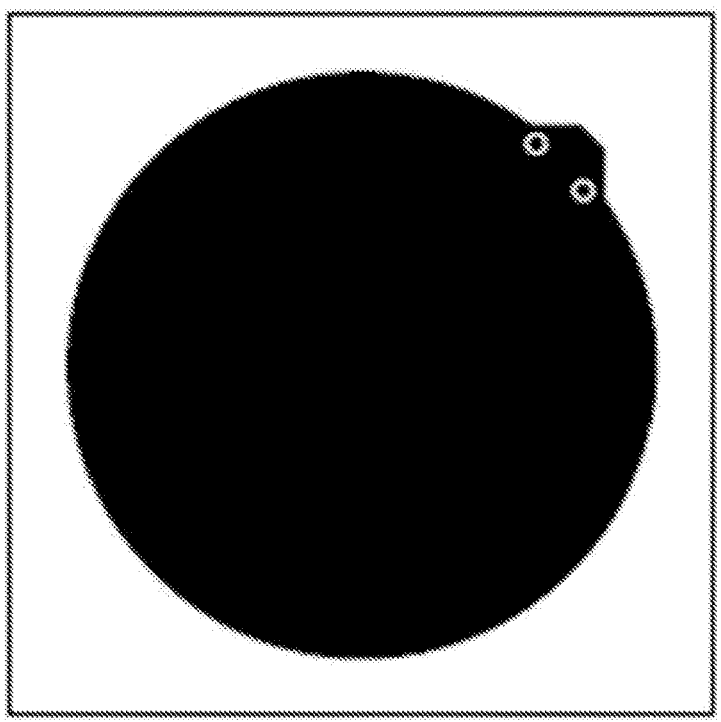
FIG. 22 is a plan view of a fourth conductive layer of the seventh multi-layer printed circuit board, for connection to 0 V to provide a shield layer.
Figure 25:
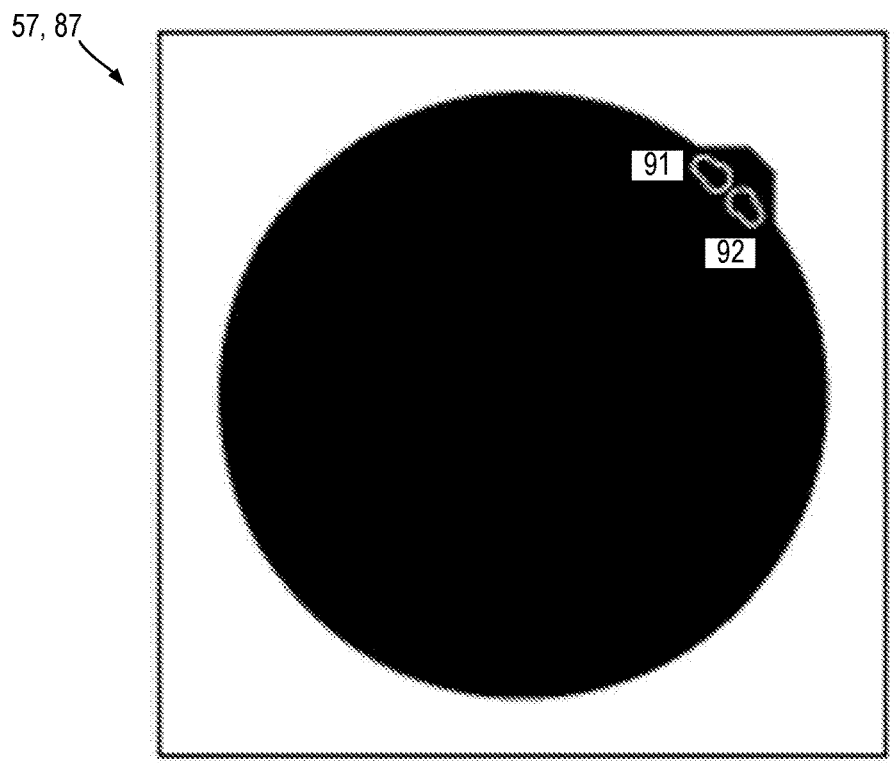
FIG. 25 is a plan view of a fifth conductive layer of the seventh multi-layer printed circuit board, for connection to 0 V to provide a shield layer.

Referring in particular to FIGS. 20, 22 and 25 (and again to FIG. 10) the sensor PCB 76 may have two shields or electrostatic screens 79, 87, which are either side of and sandwich the sensor coils 82 and 85.

The conductor (busbar) 19 has an alternating voltage applied to it which could capacitively couple in to the sensor coils 82, 85, thus shields/electrostatic screens 79 and 87 are employed to reduce the voltage coupling and so improve the performance of the current sensor.

The two sensor coils 82 and 85 have their centres 90 connected together using at least one blind via or at least one buried via. The centre 90 of the sensor coils 82 and 85 and the shields 79 and 87 may all be connected together using buried or blind vias, which enables the coils to be balanced around a central ground potential (or other applied reference potential)

Illustrative Experimental and Simulation Results

Figure 27:
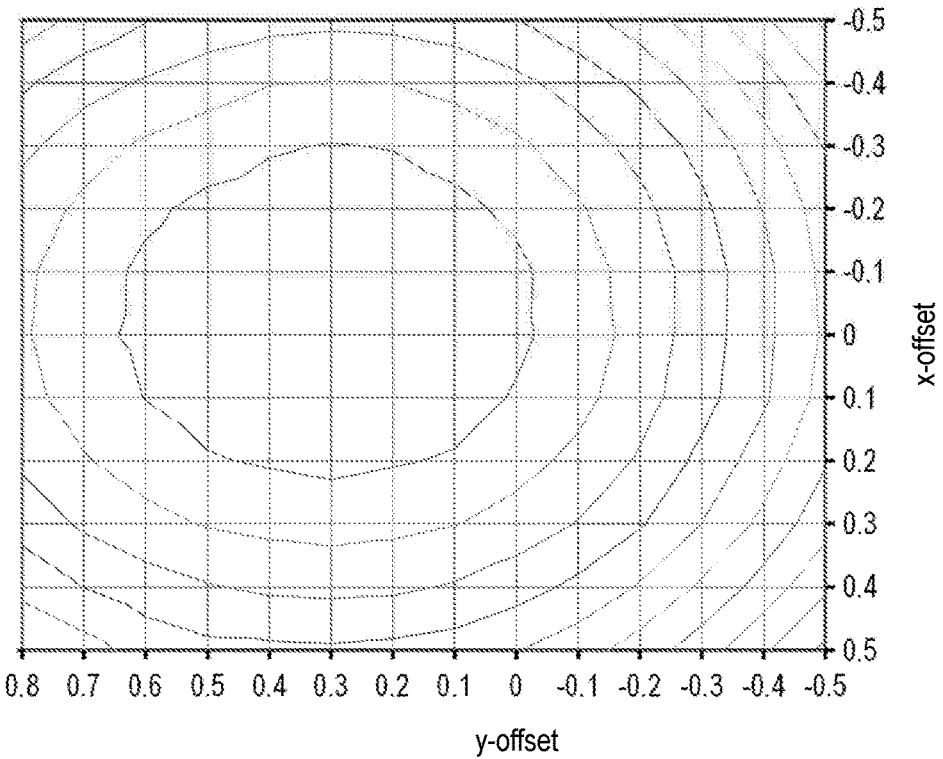
FIG. 27 shows the effect on sensor coil sensitivity of a lateral offset between sensor coils and a conductor.

Referring also to FIG. 27, a contour plot of percentage changes in measured sensitivity (in V/A) of the seventh multi-layer printed circuit board 76 is shown as a function of offset of the common magnetic centre of the sensor coils 82, 85 away from the implied centre of an omega-shaped loop portion 41 of the conductor 19.

The maximum was found at around x=0 mm and between about y=0.3 mm (0.012 inches) and y=0.4 mm (0.016 inches). The y-offset corresponds to movement along an axis passing though the gap 44 and parallel to the gap 44. The contour lines show 0.25% increments as the sensitivity decreases away from the maximum value.

It may be observed that offsetting the common effective magnetic centre of sensor coils 30, 32, 82, 85 by offset $d_{off}$ does improve sensitivity. Moreover, as the gradients are relatively shallower close to a stationary point, slight misalignments during fabrication will have less impact on the sensitivity of an electricity meter 17, 73.

This also illustrates one aspect of the need for mechanical stability, since any lateral motion of a circuit board 18, 39, 53, 61, 63, 66, 76 with respect to the conductor 19 in use would decrease the sensitivity.

Figure 28:
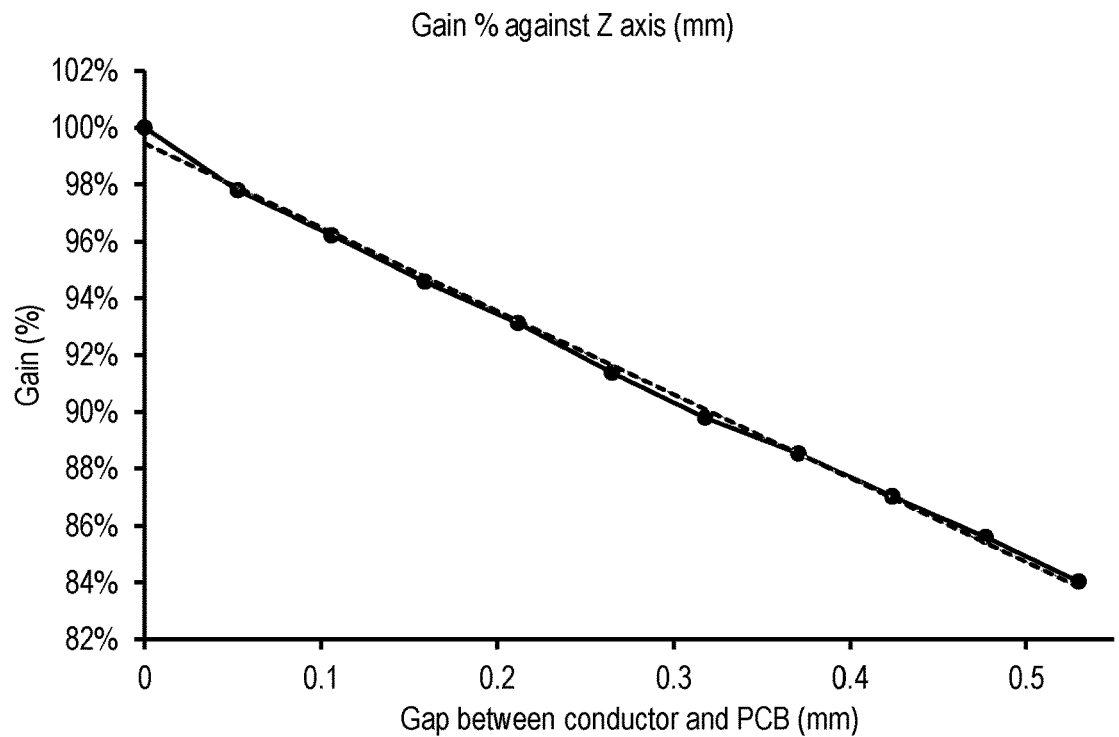
FIG. 28 shows the effect on sensor coil sensitivity of a vertical offset between sensor coils and a conductor.

Referring also to FIG. 28, another aspect of the need for mechanical stability is illustrated by a plot of gain of the sensor coils 82, 85 with the size of a gap between the conductor 19 and an example of the seventh multi-layer printed circuit board 76.

It may be observed that the gain decreases quickly with spacing, emphasising the advantages of mechanically attaching the conductor 19 to the circuit board 18, 39, 53, 61, 63, 66, 76, for example by soldering, in order to provide consistent gain in use.

Figure 29:
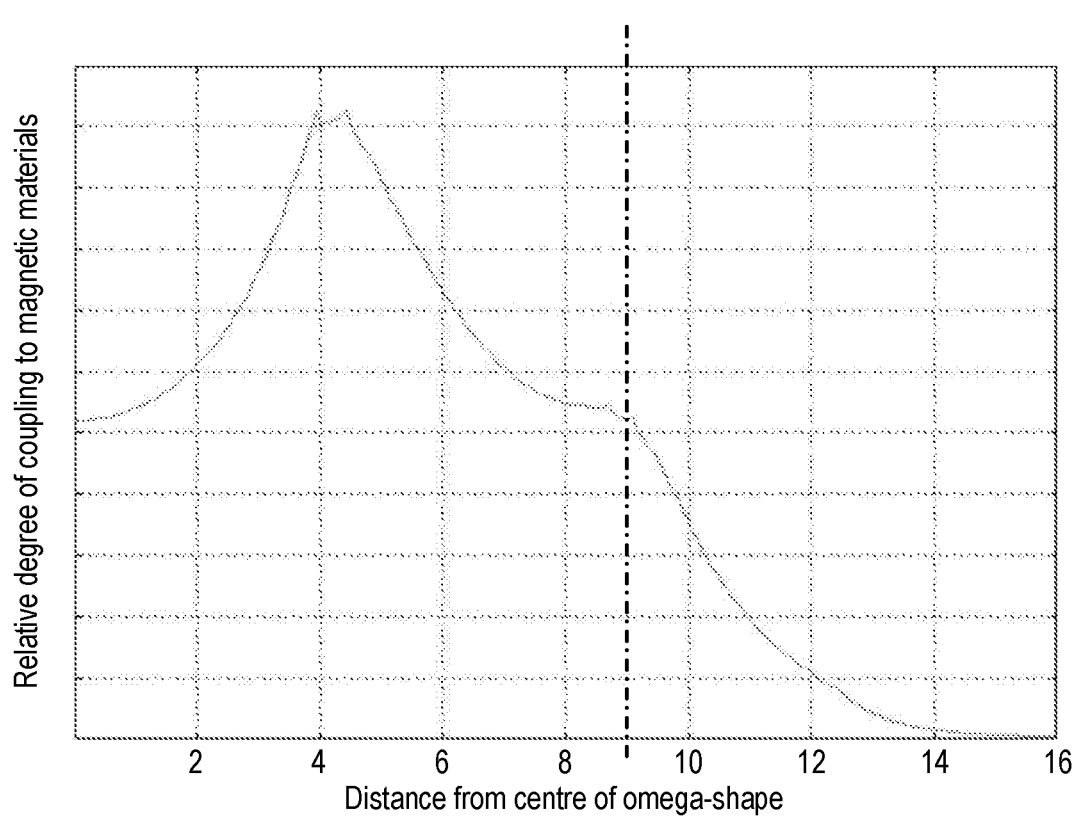
FIG. 29 shows the dependence of the degree of coupling of magnetic flux to magnetic materials as a function of distance of said magnetic materials from a conductor.

Referring also to FIG. 29, the relative degree of coupling of magnetic flux from the conductor 19 to magnetic materials is plotted against distance of said magnetic materials from the centre of an omega-shaped loop portion 41 of a simulated seventh multi-layer printed circuit board 76.

The omega-shaped loop portion 41 of the simulated conductor 19 had an outer radius of approximately 9.5 mm (0.374 inches), which is indicated in FIG. 29 by a chained line spanning the plot. It may be observed that the drop-off in relative degree of coupling to magnetic materials is surprisingly rapid. Without wishing to be bound by theory, this is believed to be the reason underlying the inventors surprising finding that components 22, 48 including magnetic materials (e.g. iron, nickel) could be placed close to, and even within 3 mm (0.118 inches) or less from the projected periphery of the conductor 19.

Modifications

It will be appreciated that various modifications may be made to the embodiments hereinbefore described. Such modifications may involve equivalent and other features which are already known in the design, manufacture and use of A.C. current measurement using a mutual inductance sensor and component parts thereof and which may be used instead of or in addition to features already described herein. Features of one embodiment may be replaced or supplemented by features of another embodiment.

Examples have been described which included first and second planar sensor coils 30, 32, 82, 85. However, as mentioned hereinbefore, electricity meters 17, 73, mutual inductance current sensors 70 and multi-layer printed circuit boards 18, 39, 53, 61, 63, 66, 76 according to the present specification are not limited to two planar sensor coils 30, 32, 82, 85, and may further include one or more additional conductive layers, wherein each conductive layer defines an additional planar sensor coil. Each such additional planar sensor coil should be separated from the first planar sensor coil, the second planar sensor coil and each other additional planar sensor coil by at least one further insulating layer. Each such additional planar sensor coils should be electrically connected to at least one other planar sensor coil by a buried via, or by a blind via extending inwards from the back surface 35. An effective magnetic centre of each of the first 30, 82, second 32, 85 and additional planar sensor coils is preferably co-axial with an effective magnetic centre of each other of the first 30, 82, second 32, 85 and additional planar sensor coils. The first 30, 82, second 32, 85 and any additional planar sensor coils are preferably connected together in series. The rotational directions of planar sensor coils connected in series may alternate/reverse between each adjacent conductive layer defining a planar sensor coil.

The number of coils increases the sensor's sensitivity which may be necessary if reduced measurement currents need to be accommodated.

In an example which covers maximum currents of 200 A and 320 A, a 32.5 by 32.5 mm (1.280 by 1.280 inch) example according to the seventh multi-layer printed circuit board 76 may achieve approximately 100 μV/A using two planar sensor coils 82, 85. In a 20 A maximum current application, 200 μV/A may be achieved when four planar sensor coils are employed (not shown).

Examples have been described which include first planar sensor coils 30, 82 and second planar sensor coils 32, 85. However, in some examples a second planar sensor coil 32, 85 may be omitted. For example, a further multi-layer printed circuit board (not shown) may include two or more insulating layers 26, including at least the first and second insulating layers 27, 33. The first conductive layer 29 may be disposed between the first and second insulating layers 27, 33 as described hereinbefore. The first planar sensor coil 30 is electrically connected to the back surface 35 by a blind via (not shown) extending inwards from the back surface 35. In this way, many of the same advantages in terms of creepage distance $d_{creep}$ and voltage stand-off may be obtained using a simplified multi-layer printed circuit board (not shown).

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. An electricity meter comprising:
a conductor for transferring energy from a supply to a load;
a multi-layer printed circuit board mechanically attached to the conductor, the multi-layer printed circuit board comprising:
two or more insulating layers, the two or more insulating layers comprising a first insulating layer having an attachment surface facing the conductor, wherein the attachment surface is mechanically attached to the conductor directly or indirectly;
a first conductive layer comprising a first planar sensor coil, wherein the first insulating layer is between the first conductive layer and the conductor;
a second conductive layer comprising a second planar sensor coil;
a second insulating layer between the first and second conductive layers;
wherein the first planar sensor coil and the second planar sensor coil are electrically connected to one another by:
a buried via; or
a blind via extending inwards from a back surface of the multi-layer printed circuit board, the back surface being opposed to the attachment surface;
wherein a creepage distance across the surface of the multi-layer printed circuit board between the conductor and an exposed electrical connection of the multi-layer printed circuit board is greater than or equal to 7 mm.

2. An electricity meter according to claim 1, wherein the conductor defines a loop, or a portion of a loop, having first and second loop ends separated by a gap,
wherein an effective magnetic centre of the first planar sensor coil is substantially co-axial with an effective magnetic centre of the second planar sensor coil, and
wherein the common effective magnetic centre of first and second planar sensor coils is offset from a centre of the loop in a direction towards the gap.

3. An electricity meter comprising:
a conductor for transferring energy from a supply to a load;
a multi-layer printed circuit board mechanically attached to the conductor, the multi-layer printed circuit board comprising:
two or more insulating layers, the two or more insulating layers comprising a first insulating layer having an attachment surface facing the conductor;
a first conductive layer comprising a first planar sensor coil, wherein the first insulating layer is between the first conductive layer and the conductor;
a second conductive layer comprising a second planar sensor coil;
a second insulating layer between the first and second conductive layers;
a third conductive layer which comprises a conductor track disposed on the attachment surface of the first insulating layer, wherein the conductor track is soldered to the conductor;
wherein the first planar sensor coil and the second planar sensor coil are electrically connected to one another by:
a buried via; or
a blind via extending inwards from a back surface of the multi-layer printed circuit board, the back surface being opposed to the attachment surface.

4. An electricity meter according to claim 3, wherein one or more conductive layers of the multi-layer printed circuit board comprise non-magnetic plating.

5. An electricity meter according to claim 3, wherein the multi-layer printed circuit board further comprises:
a fourth conductive layer disposed between the first insulating layer and the first planar sensor coil, the fourth conductive layer defining a first electrostatic shield;
a third insulating layer disposed between the first electrostatic shield and the first planar sensor coil.

6. An electricity meter according to claim 5, wherein the first planar sensor coil, the second planar sensor coil and the first electrostatic shield layer are electrically connected to one another and to ground by the blind via extending inwards from the back surface.

7. An electricity meter according to claim 5, wherein the first planar sensor coil, the second planar sensor coil and the electrostatic shield layer are electrically connected to one another by the buried via.

8. An electricity meter according to claim 3, wherein the multi-layer printed circuit board further comprises:
a fifth conductive layer disposed between the back surface and the second planar sensor coil, the fifth conductive layer defining a second electrostatic shield;
a fourth insulating layer disposed between the second electrostatic shield and the second planar sensor coil.

9. An electricity meter according to claim 3, wherein the multi-layer printed circuit board further comprises:
one or more additional conductive layers, wherein each conductive layer comprises an additional planar sensor coil;
one or more additional insulating layers, wherein each additional planar sensor coil is separated from the first planar sensor coil, the second planar sensor coil and each other additional planar sensor coil by at least one insulating layer;
wherein each of the additional planar sensor coils is electrically connected to at least one other planar sensor coil by:
a buried via; or
a blind via extending inwards from the back surface.

10. An electricity meter according to claim 3, wherein the multi-layer printed circuit board further comprises one or more components mounted directly or indirectly on the back surface;
wherein the planar sensor coils are connected to at least one of the components through one or more blind vias.

11. An electricity meter according to claim 10, wherein in dependence upon the components and/or connectors include magnetically active materials, such components and/or connectors are directly or indirectly supported on the back surface so as to not overlap within 3 mm of a projected outer periphery of the conductor mechanically attached to the attachment surface.

12. An electricity meter according to claim 3, wherein the conductor defines a loop, or a portion of a loop, having first and second loop ends separated by a gap.

13. An electricity meter according to claim 12, wherein an effective magnetic centre of the first planar sensor coil is substantially co-axial with an effective magnetic centre of the second planar sensor coil;

wherein the common effective magnetic centre of first and second planar sensor coils is offset from a centre of the loop in a direction towards the gap.

14. An electricity meter according to claim 13, wherein the common effective magnetic centre of first and second planar sensor coils is arranged to substantially correspond with a stationary point of a sensitivity in µV/A as a function of the position of the common effective magnetic centre in a plane perpendicular to a thickness of the multi-layer printed circuit board.

15. An electricity meter according to claim 3, wherein the first planar sensor coil comprises:
 a first number of turns having a first sense of rotation;
 a second number of turns connected in series with the first number of turns, the second number of turns having a second, opposite sense of rotation;
 wherein the second planar sensor coil comprises:
  a third number of turns having the second sense of rotation;
  a fourth number of turns connected in series with the third number of turns, the second number of turns having the first sense of rotation.

16. An electricity meter according to claim 15, wherein the first and second planar sensor coils are configured such that:
 a first voltage signal induced in the first number of turns in response to a magnetic flux other than from the conductor will be substantially equal and opposite to a second voltage signal induced in the second number of turns by the magnetic flux other than from the conductor; and
 a third voltage signal induced in the third number of turns in response to the magnetic flux other than from the conductor will be substantially equal and opposite to a fourth voltage signal induced in the fourth number of turns by the magnetic flux other than from the conductor.

17. An electricity meter according to claim 3, wherein a creepage distance across the surface of the multi-layer printed circuit board between the conductor and an exposed electrical connection of the multi-layer printed circuit board is greater than or equal to 7 mm.

18. An electricity meter according to claim 3, further comprising:
 a second conductor for transferring energy from a supply to a load;
 a second multi-layer printed circuit board mechanically attached to the second conductor, wherein the second multi-layer printed circuit board is identical to the multi-layer printed circuit board.

19. An electricity meter according to claim 3, wherein the sensitivity of an inductive current sensor formed by the conductor and the multi-layer printed circuit board is at least 60 µV/A.

20. An electricity meter according to claim 3, wherein the electricity meter meets American National Standards Institute, ANSI, requirements.

* * * * *